(12) United States Patent
Kikuchi et al.

(10) Patent No.: US 8,343,830 B2
(45) Date of Patent: Jan. 1, 2013

(54) SEMICONDUCTOR DEVICE AND METHOD FOR MANUFACTURING THE SAME

(75) Inventors: Hideaki Kikuchi, Kawasaki (JP); Kouichi Nagai, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/059,754

(22) Filed: Mar. 31, 2008

(65) Prior Publication Data
US 2008/0191253 A1 Aug. 14, 2008

Related U.S. Application Data

(63) Continuation of application No. PCT/JP2005/018173, filed on Sep. 30, 2005.

(51) Int. Cl.
*H01L 21/8242* (2006.01)

(52) U.S. Cl. ............... 438/250; 438/253; 257/E21.646; 257/300; 257/310

(58) Field of Classification Search ........... 257/E29.342, 257/296–313, E21.646, E21.647, E21.648; 438/240, 250, 253, 393, 396, 652, 673, 700
See application file for complete search history.

(56) References Cited

U.S. PATENT DOCUMENTS

| | | | |
|---|---|---|---|
| 5,877,081 A * | 3/1999 | Matsumoto et al. | 438/624 |
| 6,025,645 A | 2/2000 | Tomita et al. | |
| 6,127,265 A * | 10/2000 | Tomita | 438/637 |
| 6,501,112 B1 | 12/2002 | Sashida | |
| 6,635,529 B2 | 10/2003 | Inomata | |
| 6,727,170 B2 * | 4/2004 | Takata et al. | 438/622 |
| 6,897,503 B2 * | 5/2005 | Otani et al. | 257/295 |
| 6,919,593 B2 | 7/2005 | Ishihara | |
| 2003/0030085 A1 | 2/2003 | Ishihara | |
| 2003/0176037 A1 * | 9/2003 | Inomata | 438/253 |

FOREIGN PATENT DOCUMENTS

| | | |
|---|---|---|
| JP | 08-250589 A | 9/1996 |
| JP | 08-293549 A | 11/1996 |
| JP | 08-330417 A | 12/1996 |
| JP | 08-330422 A | 12/1996 |
| JP | 10-209277 A | 8/1998 |
| JP | 10-303299 A | 11/1998 |
| JP | 11-008299 A | 1/1999 |
| JP | 11-186382 A | 7/1999 |
| JP | 11-274297 A | 10/1999 |
| JP | 2002-026286 A | 1/2002 |
| JP | 2002-343857 A | 11/2002 |

(Continued)

OTHER PUBLICATIONS

JP 2003-273217 A—machine translation.*

(Continued)

*Primary Examiner* — Julio J Maldonado
*Assistant Examiner* — Sonya McCall Shepard
(74) *Attorney, Agent, or Firm* — Fujitsu Patent Center

(57) ABSTRACT

There is provided a method for manufacturing a semiconductor device, including, forming a first insulating film on a semiconductor substrate, forming a capacitor on the first insulating film, forming a second insulating film covering the capacitor, forming a metal wiring on the second insulating film, forming a first capacitor protective insulating film covering the metal wiring and the second insulating film, forming an insulating sidewall on a side of the metal wiring, forming a third insulating film on the insulating sidewall, forming a hole by etching the third insulating film under a condition that an etching rate of the insulating sidewall would be lower than that of the third insulating film, and forming a conductive plug inside the hole.

15 Claims, 32 Drawing Sheets

FOREIGN PATENT DOCUMENTS

| | | |
|---|---|---|
| JP | 2003-060164 A | 2/2003 |
| JP | 2003-273217 A | 9/2003 |
| JP | 2003-273325 A | 9/2003 |
| JP | 2004-235287 A | 8/2004 |

OTHER PUBLICATIONS

Search Report dated Dec. 13, 2005 issued in corresponding International Application No. PCT/JP2005/018173.

* cited by examiner

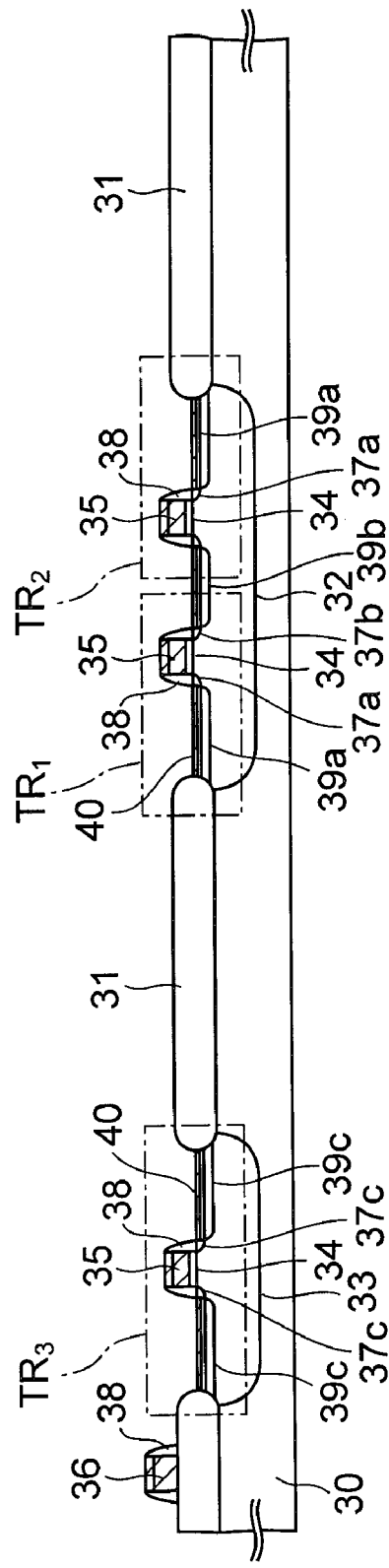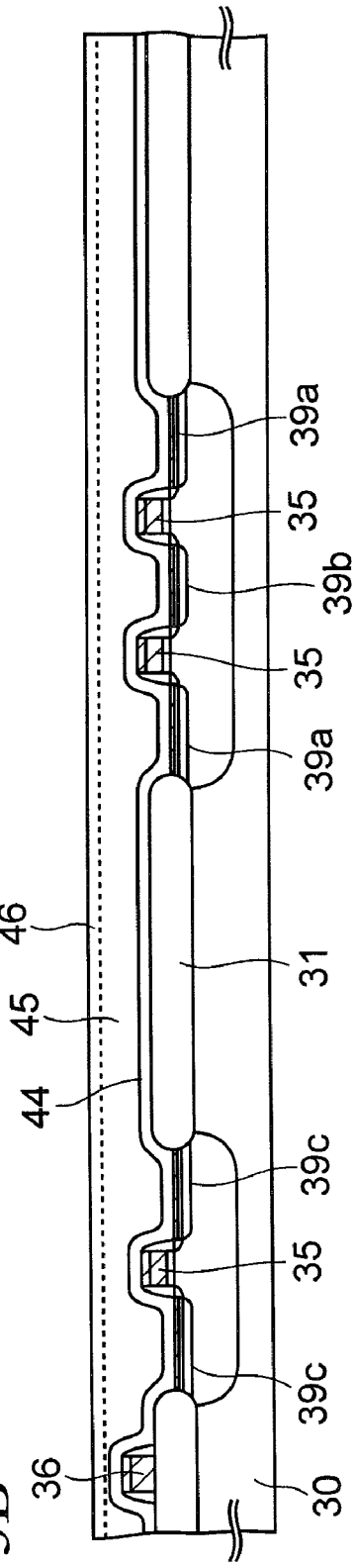

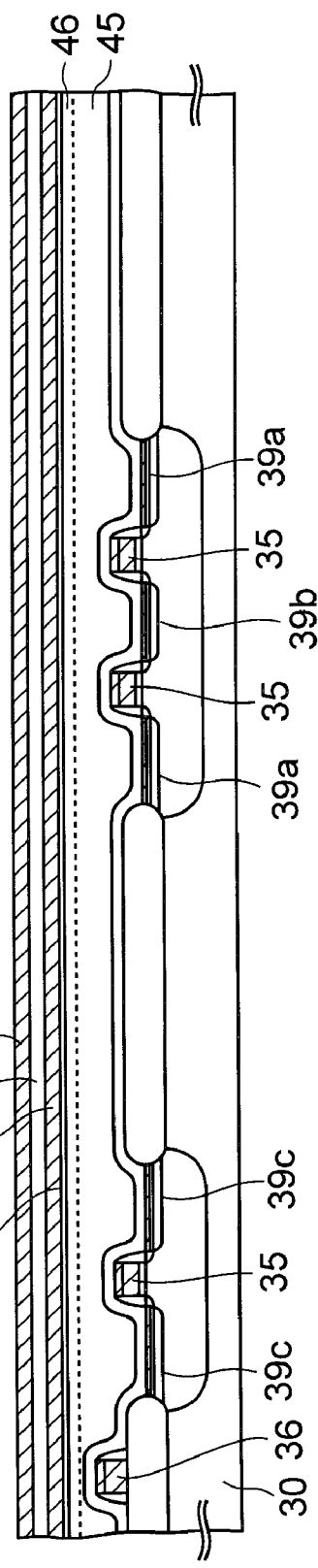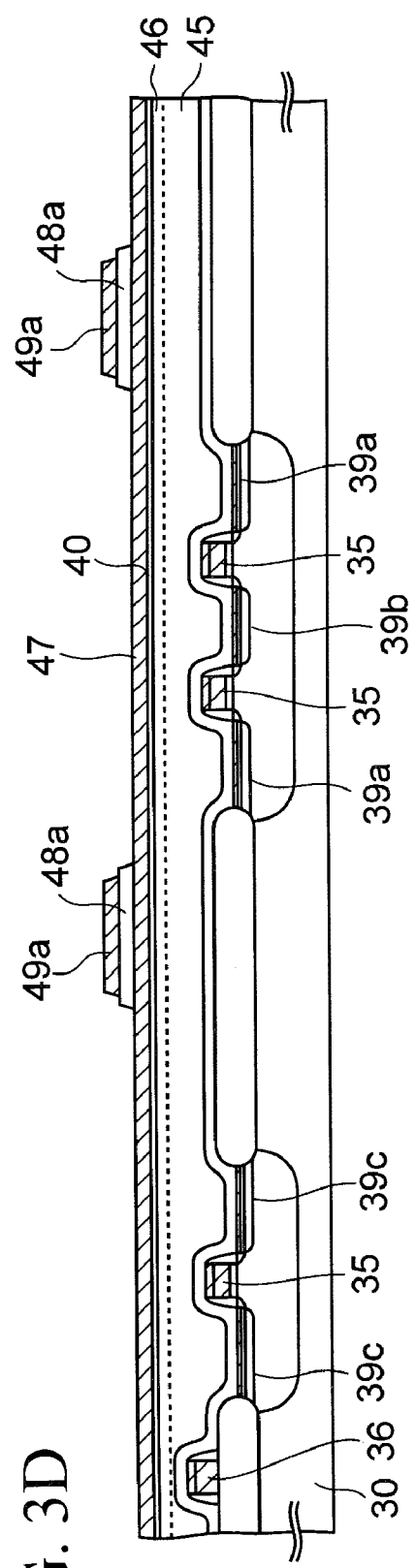

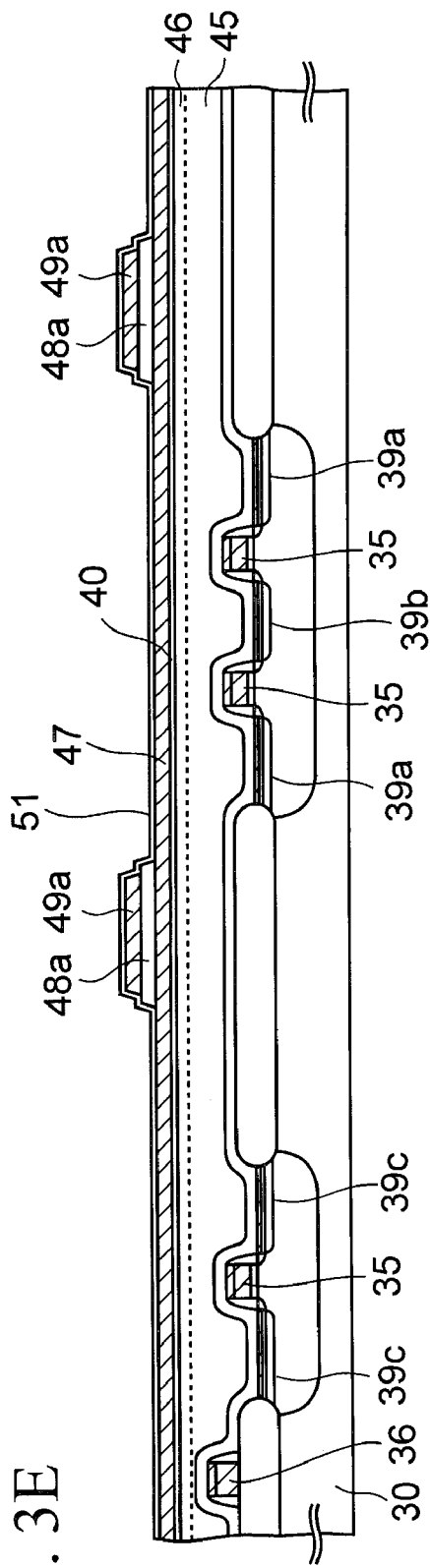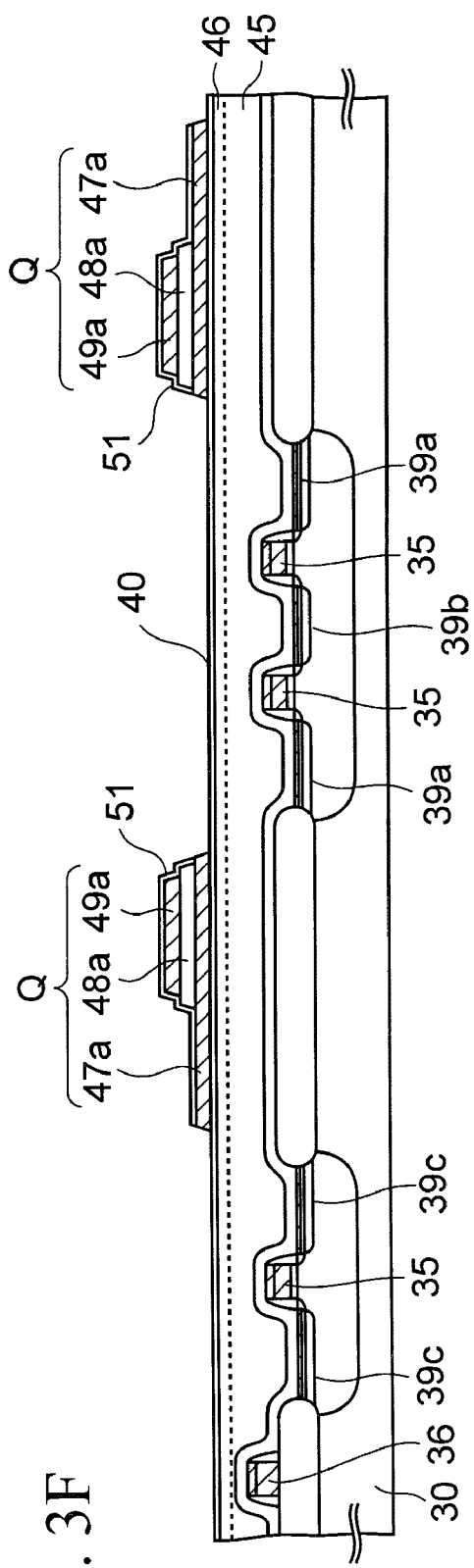

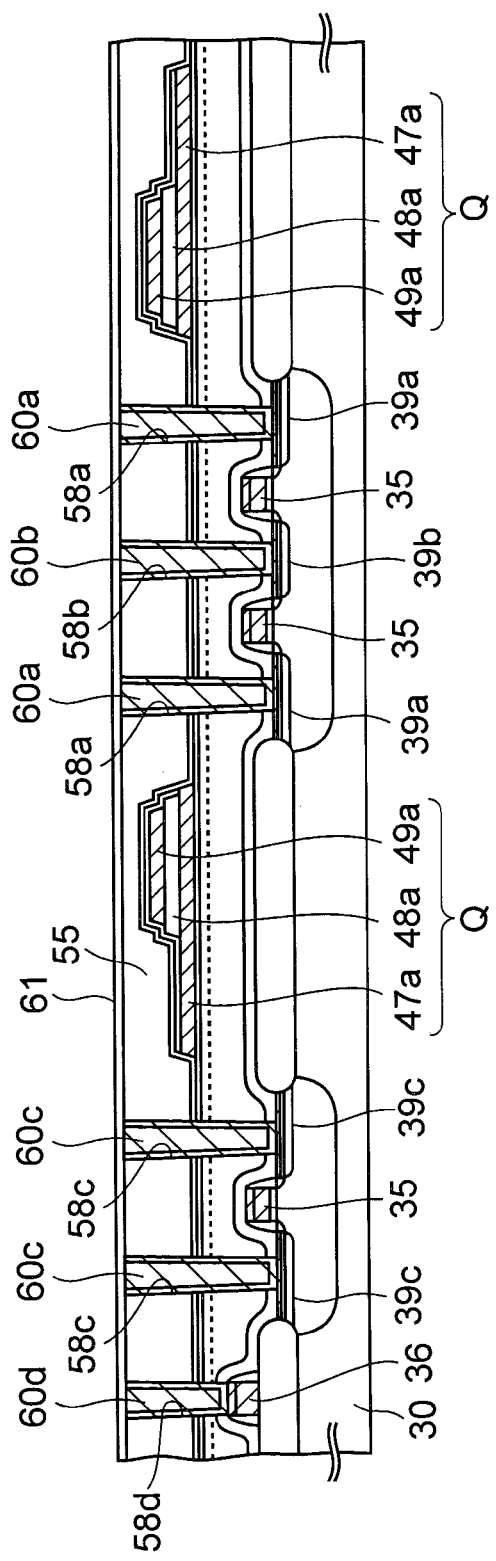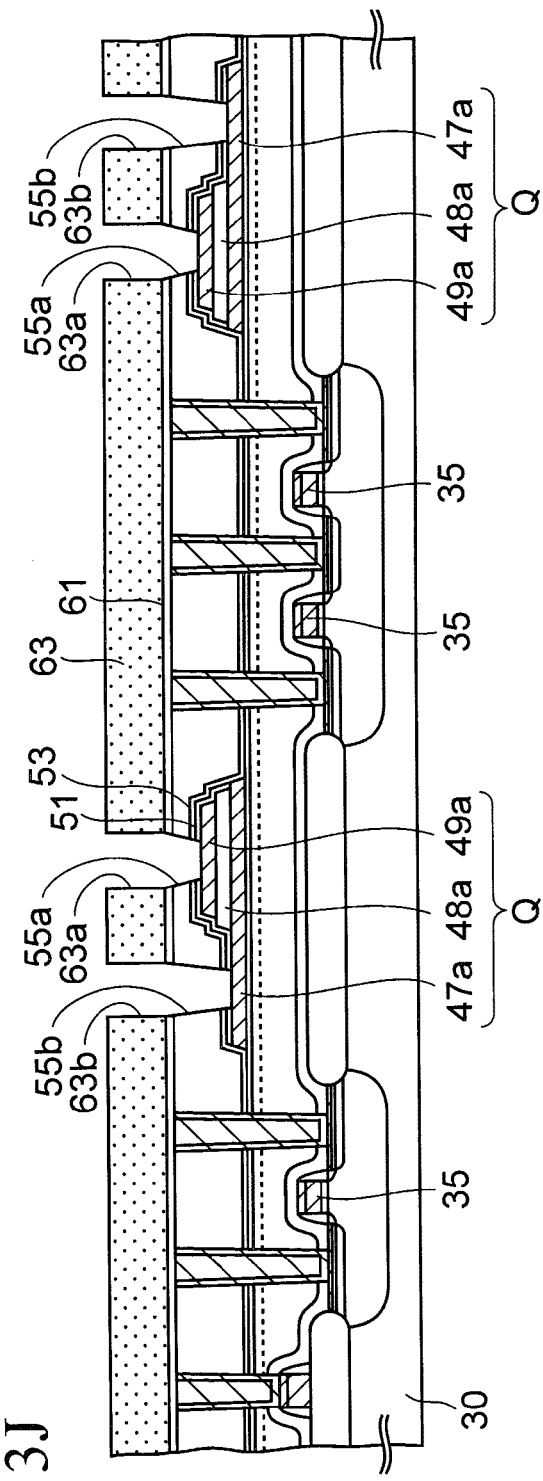
FIG. 3I
FIG. 3J

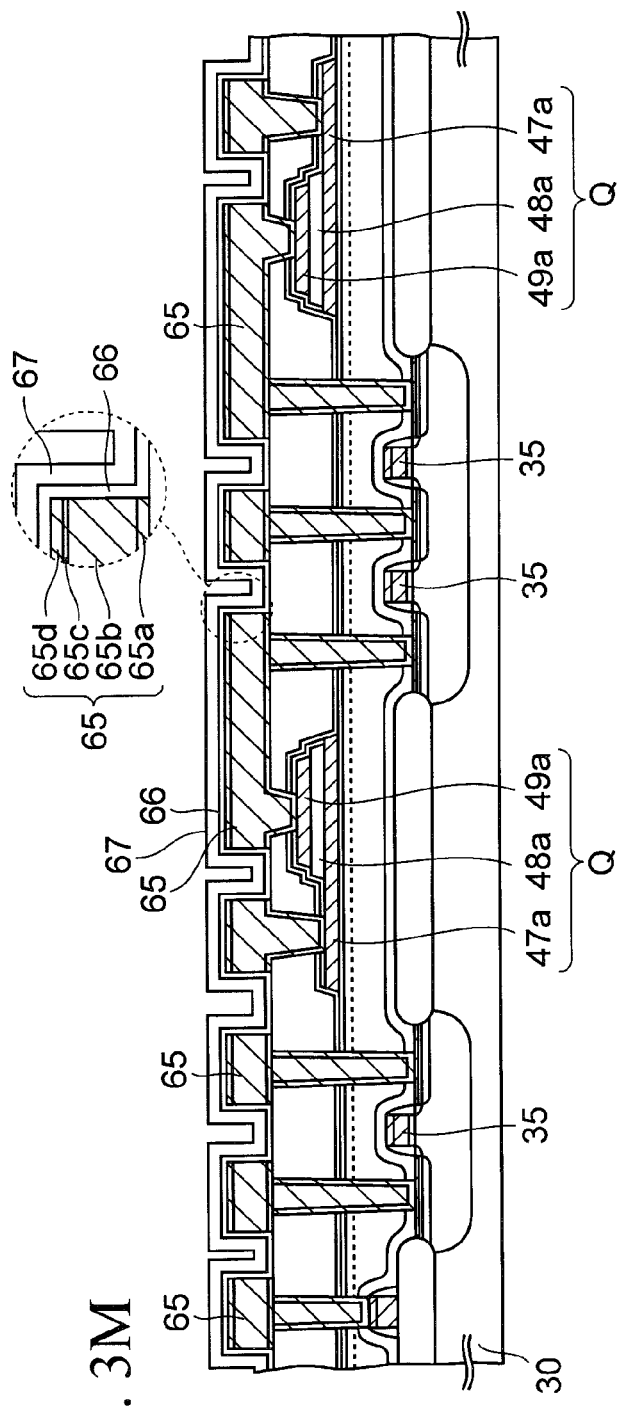

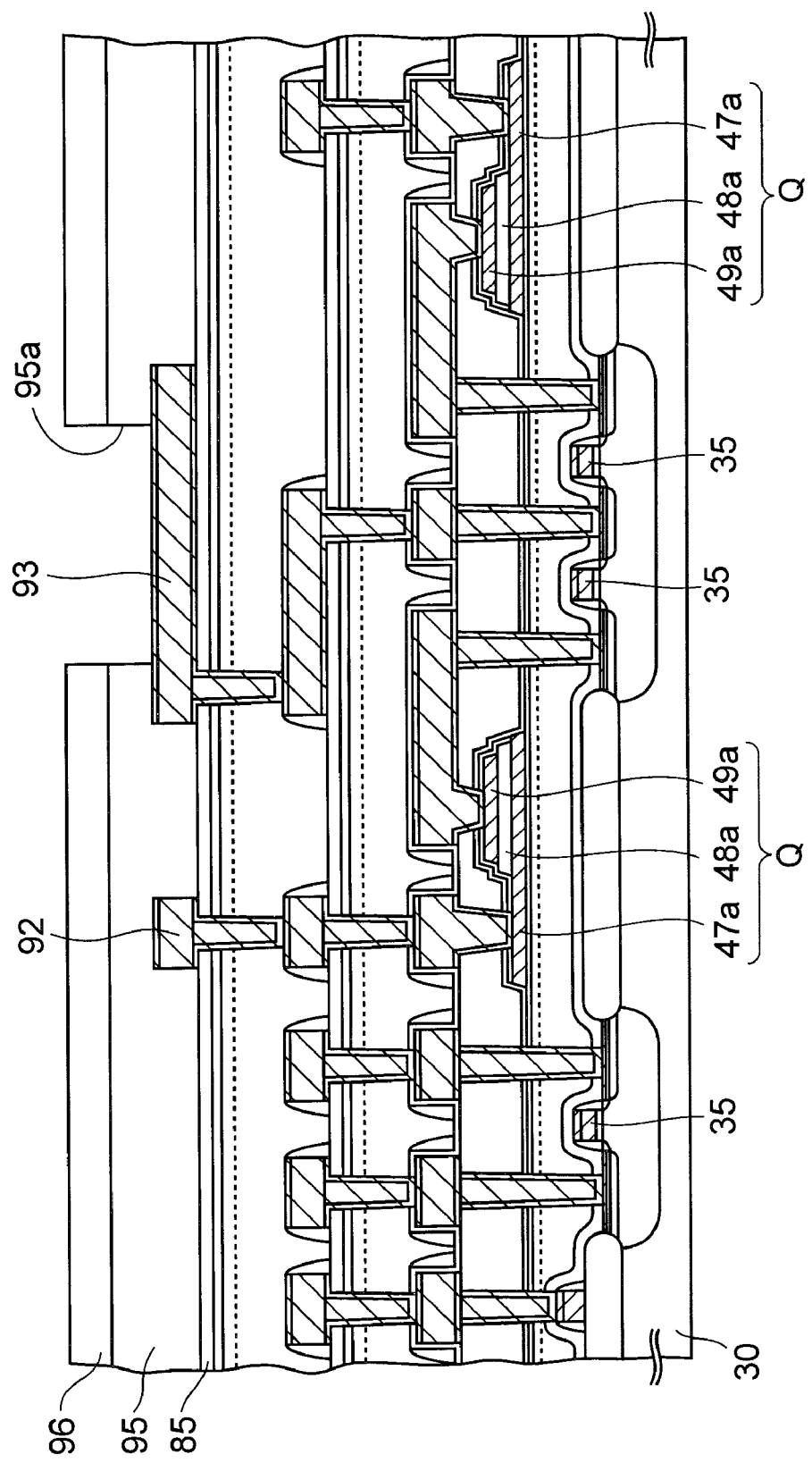

US 8,343,830 B2

SEMICONDUCTOR DEVICE AND METHOD FOR MANUFACTURING THE SAME

CROSS-REFERENCE TO RELATED APPLICATIONS

This application is a continuation of prior International Patent Application No. PCT/JP2005/018173, filed Sep. 30, 2005, the entire contents of which are incorporated herein by reference.

TECHNICAL FIELD

It is related to a semiconductor device and a method for manufacturing the same.

BACKGROUND

A flash memory and a ferroelectric memory are well-known as nonvolatile memories capable of retaining stored information even after power is turned off.

Among these nonvolatile memories, the flash memory includes a floating gate embedded in a gate insulating film of an insulated-gate field-effect transistor (IGFET), and stores information by accumulating, in this floating gate, electric charges indicating information to be stored. However, since a tunnel current needs to pass through the gate insulating film at the time of writing and erasing the information, the flash memory has a drawback that a relatively high voltage is needed.

In contrast, the ferroelectric memory, which is also referred to as a ferroelectric random access memory (FeRAM), stores information by utilizing the hysteresis characteristic of a ferroelectric film provided to a ferroelectric capacitor. The ferroelectric film is polarized in response to a voltage applied between upper and lower electrodes of the capacitor, and spontaneous polarization remains even after the voltage is removed. When the polarity of the applied voltage is reversed, the spontaneous polarization is also reversed. By causing directions of the spontaneous polarization to correspond respectively to "1" and "0", the information is written in the ferroelectric film. Advantages of the FeRAM are that the voltage required for writing is lower than that required for writing in the flash memory, and that information can be written at a higher speed than that of the flash memory.

In the above-described FeRAM, a metal wiring is formed on an interlayer insulating film for applying a voltage to upper and lower electrodes of the capacitor. Examples of structures of metal wirings are shown in Japanese Patent Application Publication Nos. 8-330417, 11-274297, 2002-343857, 11-8299, 10-209277, 8-293549, 8-250589, 11-186382, 8-330422 (hereinafter referred to simply as Patent Documents 1 to 9, respectively).

Of these patent documents, in the patent documents 1 to 7, sidewalls are formed on sides of a wiring so that a margin for alignment of a contact hole and a wiring is made larger.

In addition, in the patent documents 8 and 9, insulating sidewalls are formed on sides of a wiring so as to prevent a conductive plug from increasing contact resistance even if the conductive plug on the wiring is misaligned.

SUMMARY

It is an aspect of the embodiments discussed herein to provide a method for manufacturing a semiconductor device including, forming an insulating sidewall on the first capacitor protective insulating film beside the metal wiring, and forming a third insulating film over the insulating sidewall to cover the metal wiring with the third insulating film.

DETAILED DESCRIPTION OF THE EMBODIMENTS

Embodiments of the present application will be described below in detail by referring to the accompanying drawings.

(1) Preliminary Explanation

Prior to describing embodiments, preliminary explanation will be given below.

In a ferroelectric capacitor provided to a FeRAM, a metal oxide film such as a PZT ($Pb(Zr_x,Ti_{1-x})O_3$) film, is used as a capacitor dielectric film. When the metal oxide film is exposed to a reductant such as hydrogen or moisture, oxygen in the metal oxide film is deoxidized. Thus, the metal oxide film is caused to be in the state of shortage of oxygen, so that its ferroelectric characteristic, such as a residual amount of polarized electric charges, is deteriorated. For this reason, in order to protect the ferroelectric film from the above-described reductant, a capacitor protective insulating film such as an alumina film is formed in the FeRAM. The capacitor protective insulating film has a function to prevent a reductant from coming into contact with the ferroelectric film, and is formed, for example, between upper and lower wirings.

A hypothetical semiconductor device provided with such a capacitor protective insulating film made of an alumina film will be described below along with its manufacturing processes.

FIGS. 1A to 1F are cross-sectional views of manufacturing the hypothetical semiconductor device.

Figure 1A:
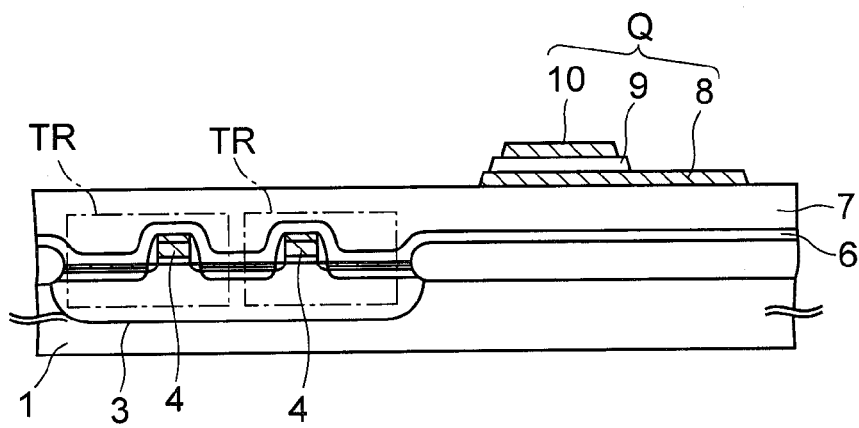
FIGS. 1A to 1F are cross-sectional views showing processes of manufacturing a hypothetical semiconductor device.

Firstly, processes for obtaining a cross-sectional structure shown in FIG. 1A will be described.

MOS transistors TR constructed from a gate electrode 4 and the like are formed on a silicon substrate 1.

Then, the MOS transistors TR are covered with a cover insulating film 6 such as a silicon nitride film. Thereafter, a silicon oxide film is formed on the cover insulating film 6. The silicon oxide film thus formed is used as a first insulating film 7.

Subsequently, the upper surface of the first insulating film 7 is polished and planarized by a chemical mechanical polishing (CMP) method.

Thereafter, a capacitor Q, which is made by stacking a lower electrode 8, a capacitor dielectric film 9, and an upper electrode 10 in this order, is formed on the upper surface of the planarized first insulating film 7.

Figure 1B:
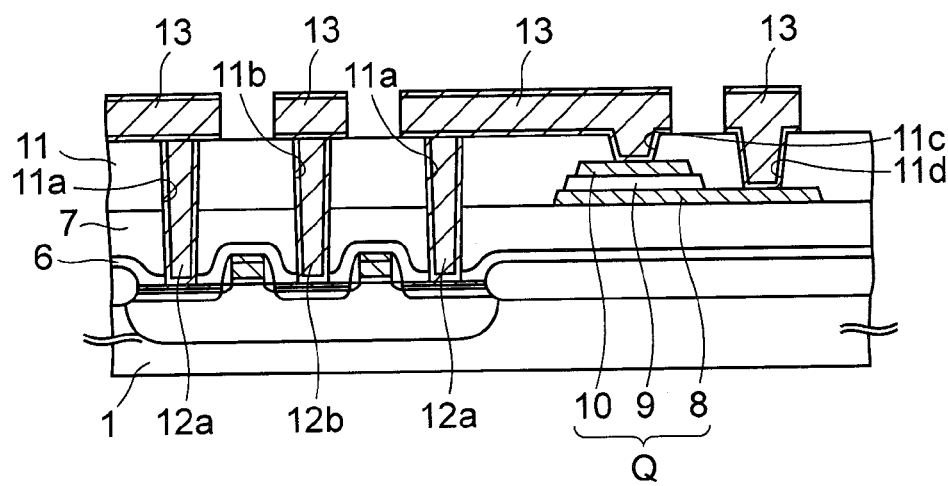

Next, as shown in FIG. 1B, a silicon oxide film as a second insulating film 11 is formed on an entire upper surface of the silicon substrate 1. Unevenness formed on the upper surface of the second insulating film 11 reflecting the shape of the capacitor Q is planarized by polishing of the CMP method.

Furthermore, films from the second insulating film 11 to the cover insulating film 6 are patterned by photolithography, so that first and second holes 11a and 11b, each of which has a depth reaching a source/drain region of the MOS transistor TR, are formed in these insulating films.

Thereafter, first and second conductive plugs 12a and 12b are respectively formed in these holes 11a and 11b. Then, in order to prevent the first and second conductive plugs 12a and 12b from being oxidized, a SiON film as an oxidation preventive insulating film (not shown) is formed on upper surfaces of these conductive plugs and the second insulating film 11.

Subsequently, the second insulating film 11 is patterned again to form third and fourth holes 11c and 11d respectively on the upper electrode 10 and the lower electrode 8. After that, the above-described oxidation preventive insulating film is removed, and then first layer metal wirings 13 are formed on inner surfaces of these holes 11c and 11d and the upper surface of the second insulating film 11.

Figure 1C:
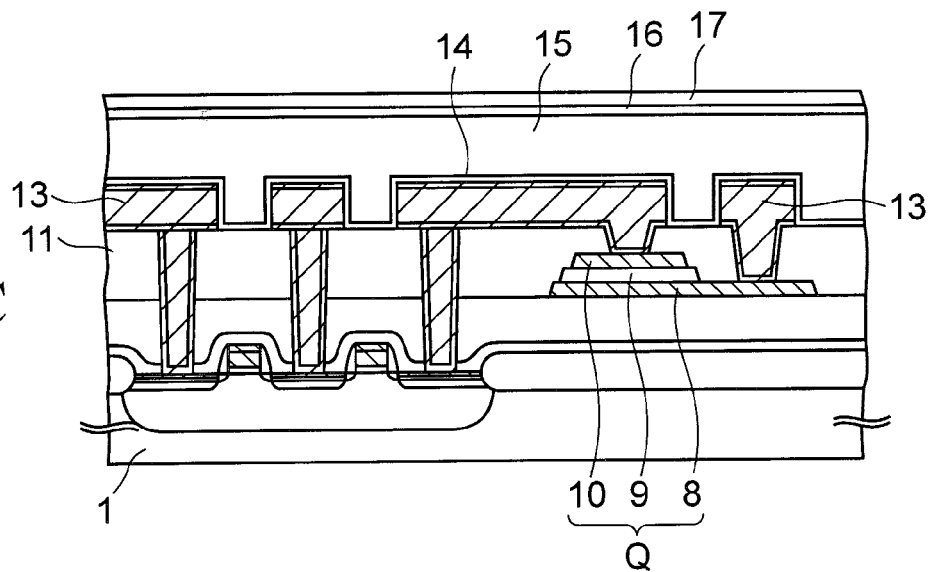

Next, as shown in FIG. 1C, in order to protect the capacitor dielectric film 9 from a reductant such as hydrogen or moisture, an alumina film is formed on the first layer metal wirings 13 as a first capacitor protective insulating film 14 by a sputtering method.

Furthermore, a silicon oxide film as a third insulating film 15 is formed on the first capacitor protective insulating film 14 by a plasma CVD method. Thereafter, the upper surface of the third insulating film 15 is planarized by polishing of the CMP method.

Here, in order to further effectively prevent deterioration of the capacitor dielectric film 9, an alumina film as a second capacitor protective insulating film 16 is formed on the third insulating film 15 by the sputtering method.

Thereafter, a silicon oxide film is formed on this second capacitor protective insulating film 16. This silicon oxide film is used as a cap insulating film 17.

Figure 1D:
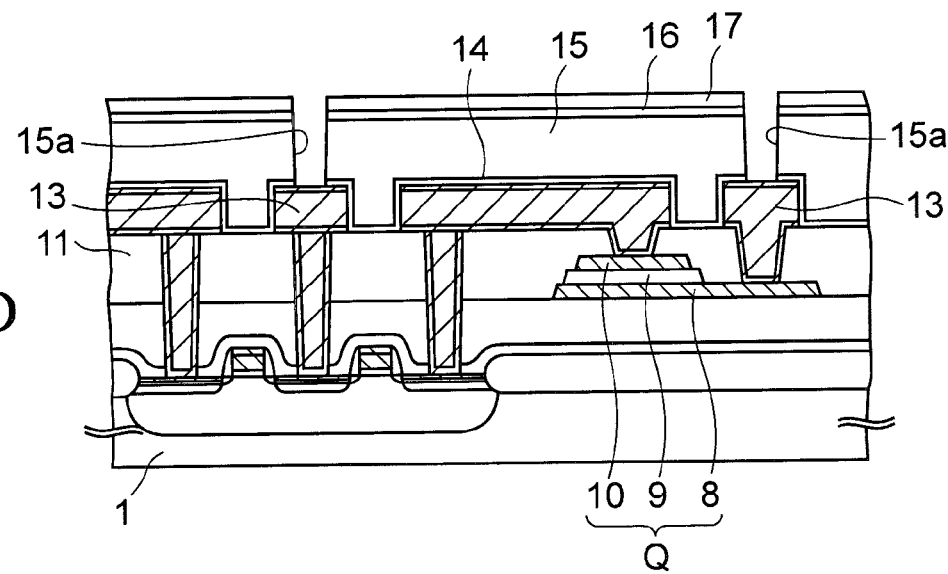

Next, as shown in FIG. 1D, the above-described insulating films 14 to 17 are patterned to form fifth holes 15a on the first layer metal wirings 13.

Figure 1E:
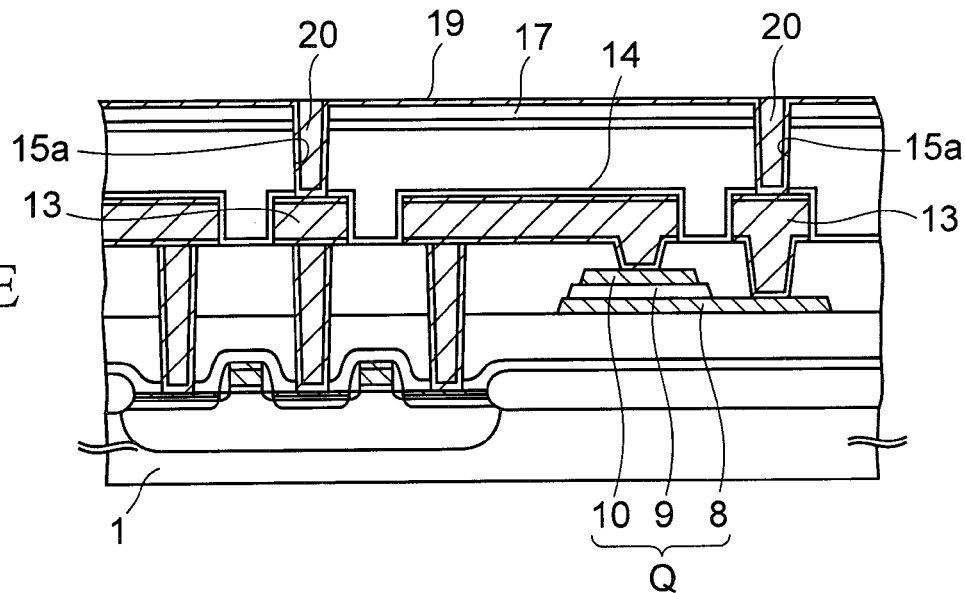

Next, processes for obtaining a cross-sectional structure shown in FIG. 1E will be described.

Firstly, a titanium nitride film as a glue film 19 is formed on inner surfaces of the fifth holes 15a and the upper surface of the cap insulating film 17 by the sputtering method.

Subsequently, a tungsten film with an thickness of filling the fifth holes 15a is formed on this glue film 19. Thereafter, the excessive tungsten film on the cap insulating film 17 is polished and removed by the CMP method to leave the tungsten film only in the fifth holes 15a as third conductive plugs 20.

Figure 1F:
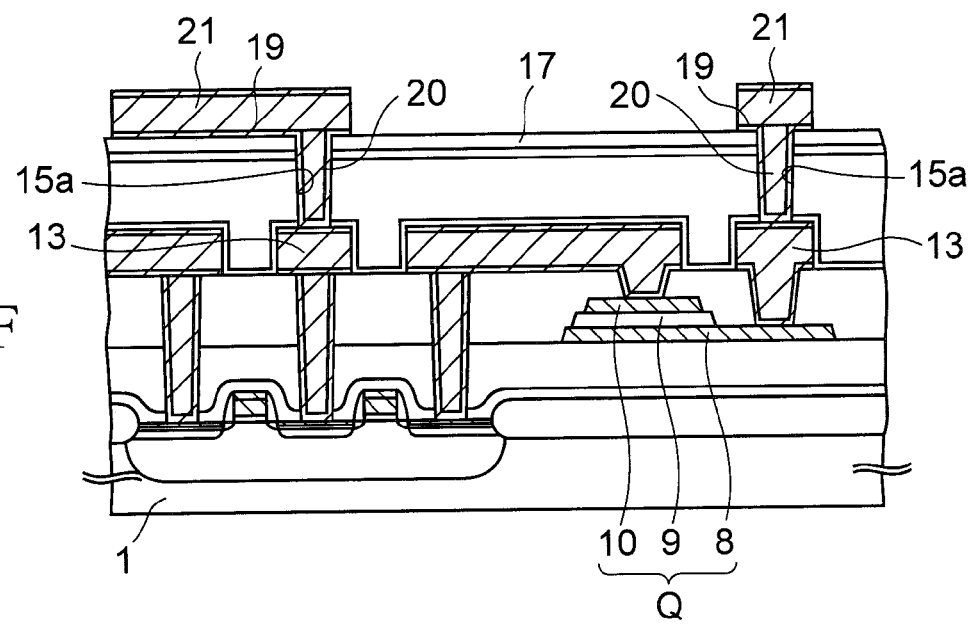

Next, as shown in FIG. 1F, a metal laminated film including an aluminum film is formed on the glue film 19 by the sputtering method. This metal laminated film and the glue film 19 are then patterned to form second layer metal wirings 21.

With the processes described so far, the basic structure of the FeRAM is completed.

According to the above-described method for manufacturing a semiconductor device, as described in FIG. 1D, the fifth holes 15a are formed on the first layer metal wirings 13. There is no particular problem as long as the fifth holes 15a are aligned with the first layer metal wirings 13 as designed as shown in the figure. However, if a resist pattern (not shown) to be a mask for etching and the silicon substrate 1 are misaligned in the photolithography for forming the fifth holes 15a, the fifth holes 15a may be displaced from the first layer metal wirings 13.

Figure 2A:
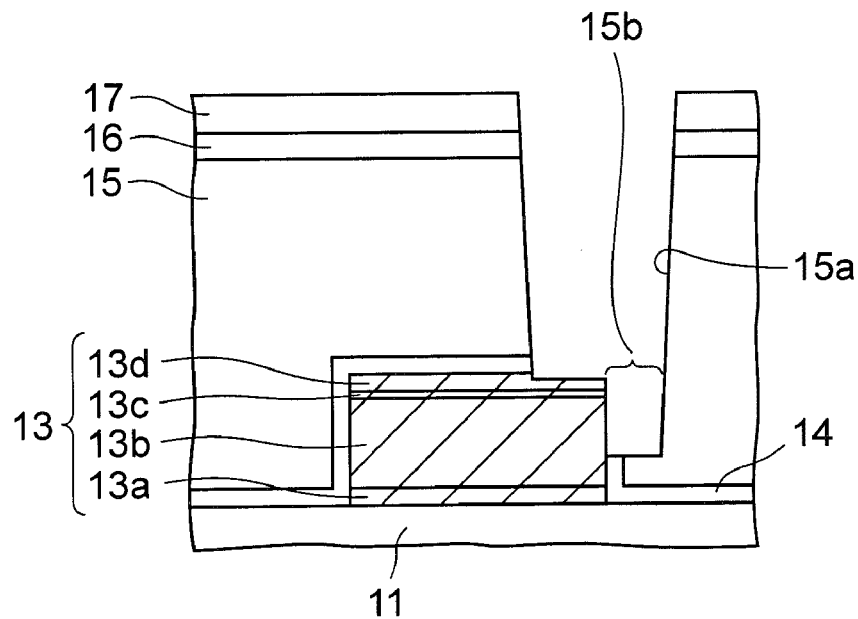
FIGS. 2A and 2B are enlarged cross-sectional views, each showing a case where a fifth hole is displaced from a first layer metal wiring in the hypothetical semiconductor device.
Figure 2B:
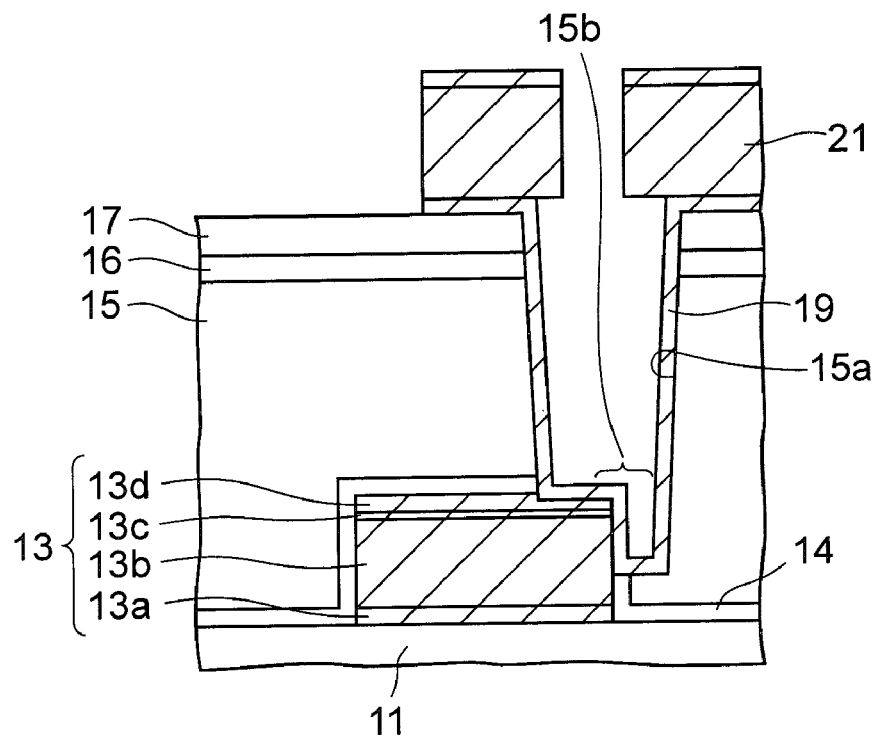

FIGS. 2A and 2B are enlarged cross-sectional views for describing a problem caused when the fifth hole 15a is displaced from the first layer metal wiring 13.

As shown in FIG. 2A, the first layer metal wiring 13 is formed by laminating, from the bottom thereof, a titanium nitride film 13a, an aluminum film 13b, a titanium film 13c, and titanium nitride film 13d in this order. Then, when the fifth hole 15a is displaced from this first layer metal wiring 13, a grove 15b is formed in the third insulating film 15 beside the first layer metal wiring 13, and a surface of the aluminum film 13b is exposed on a side surface of the groove 15b.

When the groove 15b is formed in this manner, etching products generated at the time of forming the hole 15a by etching the first and second capacitor protective insulating films 14 and 16 made of alumina are stuck in the groove 15b. Since alumina is difficult to be chemically etched, it is also difficult to remove the etching products caused by alumina. In addition, after the hole 15a is formed, cleaning water for cleaning an inner surface thereof is also stuck in the groove 15b.

When the third conductive plugs 20 (see FIG. 1E) made of tungsten are intended to be formed under the state where the foreign materials such as the etching products and cleaning water is present in the groove 15b, degassing is caused from the foreign materials due to heat at the time of forming the tungsten film. Accordingly, the hole 15a cannot be successfully embedded by the tungsten film.

As a result, as shown in FIG. 2B, the third conductive plug 20 cannot be formed in the fifth hole 15a. As a consequence, it is made difficult to electrically connect the first layer metal wiring 13 and the second layer metal wiring 21.

To avoid such an inconvenience, for example, the third insulating film 15 may be directly formed on the first layer metal wiring 13 without the first capacitor protective insulating film 14 so as to prevent reductants only by the second capacitor protective insulating film 16.

However, in this case, the aluminum film 13b exposed on the side surface of the first layer metal wiring 13 comes in contact with a film-forming atmosphere of the third insulating film 15. Thus, moisture contained in the film-forming atmosphere becomes hydrogen due to a reduction effect of aluminum, and ferroelectric characteristics of the capacitor dielectric film 9 (see FIG. 1F) are greatly deteriorated by that hydrogen.

Accordingly, in the case where the first layer metal wiring 13 includes an aluminum film, it is unsuitable that the first capacitor protective insulating film 14 be omitted.

Furthermore, as described above, the titanium nitride film 13d is formed on the uppermost layer of the first layer metal wiring 13. A ratio of an etching rate of the titanium nitride film 13d to that of the third insulating film 15 made of silicon oxide is relatively small. Thus, at the time when the fifth hole 15a is formed by etching, the titanium nitride film 13d is also etched to some extent. Accordingly, etching products caused by the titanium nitride film 13d are also generated, which also results in promoting the above-described degassing.

In view of the foregoing problems, the inventors of the present application have come up with embodiments described below.

(2) First Embodiment

FIGS. 3A to 3Y are cross-sectional views showing processes of manufacturing a semiconductor device according to a first embodiment.

This semiconductor device is a planar-type FePAM in which a contact region is provided in a lower electrode of a capacitor and a voltage is applied from a metal wiring over the contact region to the lower electrode. Such a semiconductor device is manufactured as follows.

Firstly, processes for obtaining a cross-sectional structure shown in FIG. 3A will be described.

A device isolation insulating film 31 is formed by thermally oxidizing a surface of an n-type or p-type silicon (semiconductor) substrate 30. This device isolation insulating film 31 defines active regions of transistors. Such a device isolation structure is referred to as local oxidation of silicon (LOCOS). However, in place of LOCOS, shallow trench isolation (STI) may be employed.

Subsequently, a p-type impurity, such as boron, is introduced into the active regions of the silicon substrate 30 to form first and second p-wells 32 and 33. Thereafter, surfaces of the active regions are thermally oxidized to form a thermal oxidation film to be a gate insulating film 34 with a thickness of approximately 6 to 7 nm.

Thereafter, an amorphous silicon film with a thickness of approximately 50 nm and a tungsten silicide film with a thickness of approximately 150 nm are sequentially formed on an entire upper surface of the silicon substrate 30. Incidentally, in place of the amorphous silicon film, a polycrystalline silicon film may be formed. After that, these films are patterned by photolithography to form gate electrodes 35 on the silicon substrate 30 and a wiring 36 on the device isolation insulating film 31.

Furthermore, by carrying out ion implantation using the gate electrodes 35 as a mask, phosphorus as an n-type impurity is introduced into the silicon substrate 30 beside the gate electrodes 35 to form first to third source/drain extensions 37a to 37c.

Thereafter, an insulating film is formed on the entire upper surface of the silicon substrate 30. The insulating film is then etched back to be left as insulating spacers 38 beside the gate electrodes 35 and the wiring 36. As for the insulating film, a silicon oxide film is formed by a CVD method, for example.

Subsequently, while using the insulating spacers 38 and the gate electrodes 35 as a mask, an n-type impurity, such as arsenic, is ion-implanted again into the silicon substrate 30, so that first to third source/drain regions 39a to 39c are formed in the silicon substrate 30 beside the gate electrodes 35.

Furthermore, a refractory metal film, such as a cobalt film, is formed on the entire upper surface of the silicon substrate 30 by the sputtering method. After that, the refractory metal film is heated to react with silicon, so that a refractory silicide layer 40, such as a cobalt silicide layer, is formed on the silicon substrate 30 in the first to third source/drain regions 39a to 39c. Thereby, each of the source/drain regions 39a to 39c is caused to have low resistance. Note that such a refractory metal silicide layer is also formed on surface layers of the gate electrodes 35 and the wiring 36.

Thereafter, the refractory metal layer, which is left unreacted on the device isolation insulating film 31 and so forth, is removed by wet etching.

With the processes described so far, first to third MOS transistors $TR_1$ to $TR_3$, which are constructed from the gate insulating film 34, the gate electrodes 35, the first to third source/drain regions 39a to 39c, and the like, are formed in the active regions of the silicon substrate 30.

Of these transistors, the first and second transistors $TR_1$ and $TR_2$ are formed in a cell region. The gate electrodes 35 of the first and second transistors $TR_1$ and $TR_2$ are formed in parallel with each other to configure one part of a word line. On the other hand, the third MOS transistor $TR_3$ is formed in a peripheral circuit region.

Next, as shown in FIG. 3B, a silicon oxynitride (SiON) film is formed with a thickness of approximately 200 nm on the entire upper surface of the silicon substrate 30 by the plasma CVD method. The silicon oxynitride film thus formed is used as a cover insulating film 44.

Furthermore, a silicon oxide (SiO) film as a first insulating film 45 is formed with a thickness of approximately 600 nm on the cover insulating film 44 by the plasma CVD method using a TEOS gas. Thereafter, the first insulating film 45 is polished by a chemical mechanical polishing (CMP) method by an extent of approximately 200 nm to planarize the upper surface of the first insulating film 45.

After that, a silicon oxide film is formed again with a thickness of approximately 100 nm on the first insulating film 45 by the plasma CVD method using the TEOS gas. The silicon oxide film thus formed is used as a first cap insulating film 46.

Thereafter, as dehydration processing of these insulating films 45 and 46, annealing is carried out in a nitrogen atmosphere at a substrate temperature of approximately 650° C. for approximately 30 minutes.

Next, processes for obtaining a cross-sectional structure shown in FIG. 3C will be described.

Firstly, a first alumina film 40 is formed with a thickness of approximately 20 nm on the first cap insulating film 46 by the sputtering method.

Then, a platinum film as a first conductive film 47 is formed on the first alumina film 40 by the sputtering method. The first conductive film 47 with a film thickness of approximately 155 nm will be patterned later to be a capacitor lower electrode.

Furthermore, a PZT film is formed with a thickness of 150 to 200 nm on the first conductive film 47 by the sputtering method. The PZT film thus formed is used as a ferroelectric film 48.

In addition to the sputtering method, a film-forming method of the ferroelectric film 48 includes a metal organic CVD (MOCVD) method and a sol-gel method. Furthermore, a material of the ferroelectric film 48 is not limited to the above-described PZT. The ferroelectric film 48 may be made of a Bi layered structure compound, such as $SrBi_2Ta_2O_9$, $SrBi_2(Ta_xNb_{1-x})_2O_9$, or $Bi_4Ti_2O_{12}$. Furthermore, the ferroelectric film 48 may be made of PLZT ($Pb_{1-x}La_xZr_{1-y}Ti_yO_3$) in which lanthanum is doped into PZT, or other metal oxide ferroelectrics.

Here, PZT formed by the sputtering method is hardly crystallized just after film formation and is thus poor in ferroelectric characteristics. Accordingly, as crystallization annealing for crystallizing PZT constituting the ferroelectric film 48, rapid thermal anneal (RTA) is carried out in an atmosphere containing oxygen at a substrate temperature of approximately 585° C. for approximately 90 seconds. Note that this crystallization annealing is not needed in the case where the ferroelectric film 48 is formed by the MOCVD method.

After that, a first iridium oxide ($IrO_2$) film is formed with a thickness of approximately 50 nm on the ferroelectric film 48 by the sputtering method. The RTA is carried out on this first iridium oxide film. Conditions for the RTA are not particularly limited. In the present embodiment, the RTA is carried out in an atmosphere containing oxygen at a substrate temperature of 725° C. for a processing time of 20 seconds.

Thereafter, a second iridium oxide film is formed with a thickness of approximately 200 nm on the first iridium oxide film by the sputtering method. A laminated film formed of these first and second iridium oxide films is used as a second conductive film 49.

Next, processes for obtaining a cross-sectional structure shown in FIG. 3D will be described.

Firstly, upper electrodes 49a are formed by patterning the second conductive film 49 by photolithography. Then, to recover damages received in the ferroelectric film 48 by the patterning, the first recovery annealing is carried out on the ferroelectric film 48 in a vertical furnace. This recovery annealing is carried out in the atmosphere containing oxygen, and conditions thereof are, for example, a substrate temperature of 650° C. and a processing time of 60 minutes.

Next, a capacitor dielectric film 48a made of a ferroelectric material, such as PZT, is formed by patterning the ferroelectric film 48 by photolithography. The damages that the capacitor dielectric film 48a received by this patterning are recovered by the second recovery annealing. The second recovery annealing is carried out in the atmosphere containing oxygen by using a vertical furnace, like the first recovery annealing. As conditions of the second recovery annealing, a substrate temperature of 350° C. and a processing time 60 minutes are employed.

Next, as shown in FIG. 3E, on the entire upper surface of the silicon substrate 30, a second alumina film 51 is formed with a thickness of approximately 50 nm by the sputtering method. The second alumina film 51 is formed for protecting the capacitor dielectric film 48a from reductants, such as hydrogen and moisture. Then, in order to recover damages received in the capacitor dielectric film 48a during the sputtering, the third recovery annealing is carried out in the atmosphere containing oxygen at a substrate temperature of 550° C. for approximately 60 minutes. This recovery annealing is carried out using a vertical furnace, like the first and second annealing.

Next, as shown in FIG. 3F, the first conductive film 47 and the second alumina film 51 are patterned by photolithography, so that the first conductive film 47 under the capacitor dielectric film 48a is set to be lower electrodes 47a, and the second alumina film 51 is left so as to cover the lower electrodes 47a.

Thereafter, in order to recover damages received in the capacitor dielectric film 48a during the processes, the fourth recovery annealing is carried out on the capacitor dielectric film 48a in the atmosphere containing oxygen under conditions with a substrate temperature of 550° C. and a processing time of 60 minutes. The recovery annealing is carried out by using, for example, a vertical furnace.

With the processes described so far, capacitors Q, each of which is formed by stacking the lower electrode 47a, the capacitor dielectric film 48a, and the upper electrode 49a in this order, are formed in the cell region of the semiconductor substrate 30.

Figure 3G:
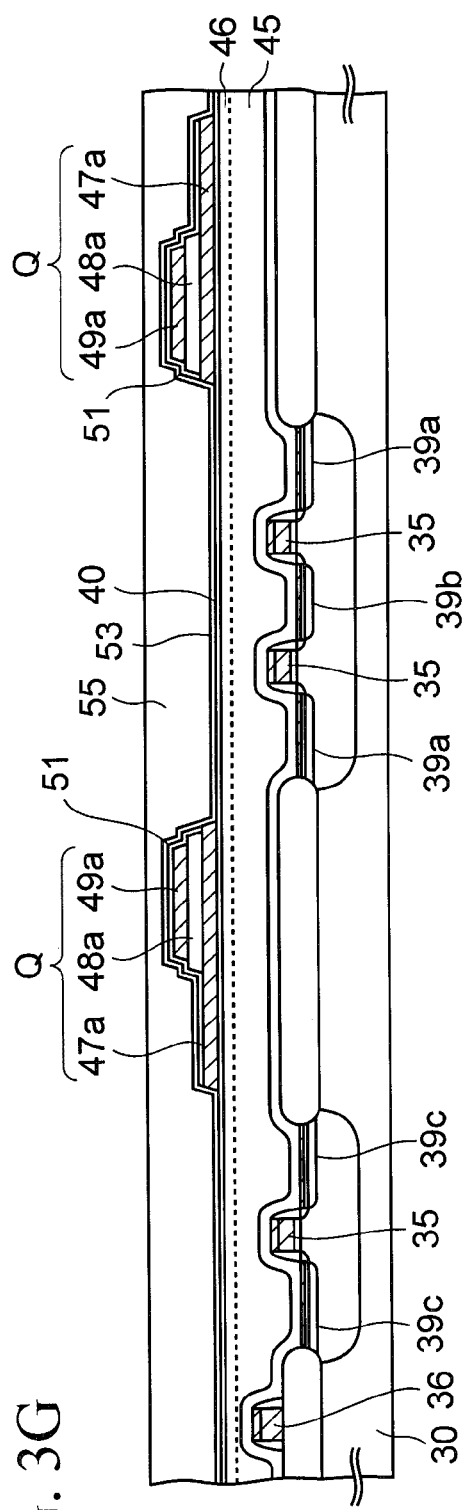
FIGS. 3A to 3Y are cross-sectional views showing processes of manufacturing a semiconductor device according to a first embodiment.

Next, as shown in FIG. 3G, a third alumina film 53 for protecting the capacitor dielectric film 48a is formed with a thickness of approximately 20 nm on the entire upper surface of the silicon substrate 30 by the sputtering method. This third alumina film 53, together with the second alumina film 51 formed thereunder, prevents reductants, such as hydrogen and moisture, from coming in contact with the capacitor dielectric film 48a, and thereby suppresses deterioration of ferroelectric characteristics of the capacitor dielectric film 48a due to reduction.

Thereafter, the fifth recovery annealing is carried out on the capacitor dielectric film 48a in the vertical furnace with the atmosphere containing oxygen, under conditions with a substrate temperature of 550° C. and a processing time of 60 minutes.

Thereafter, a silicon oxide film is formed with a thickness of approximately 1500 nm on the third alumina film 53 by the plasma CVD method using the TEOS gas. The silicon oxide film thus formed is used as a second insulating film 55. After that, the upper surface of the second insulating film 55 is polished by the CMP method to be planarized.

Figure 3H:
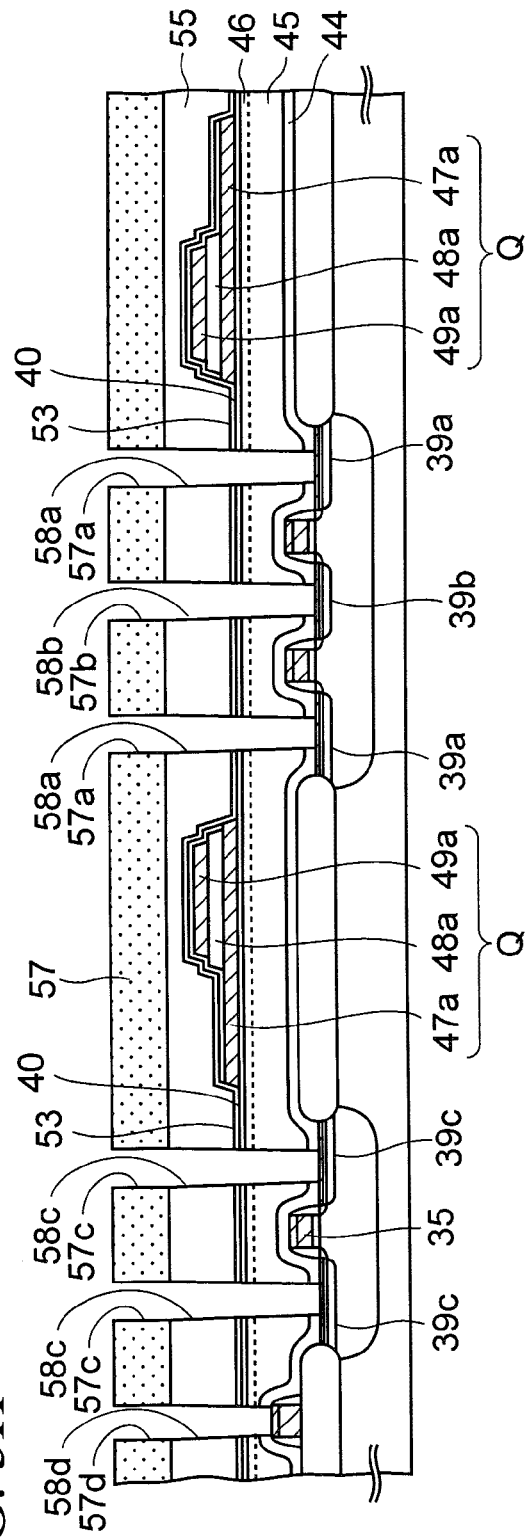

Next, processes for obtaining a cross-sectional structure shown in FIG. 3H will be described.

Firstly, the second insulating film 55 is coated with a photoresist. The photoresist is exposed and developed to form a first resist pattern 57. As shown in the figure, this first resist pattern 57 has hole-shaped first to third windows 57a to 57c over the first to third source/drain regions 39a to 39c, and fourth windows 57d over the wiring 36.

Subsequently, while using the first resist pattern 57 as a mask, films from the second insulating film 55 to the cover insulating film 44 are dry-etched, so that first to fourth contact holes 58a to 58d are formed in these insulating films under the first to fourth windows 57a to 57d.

This dry etching is carried out in three-stepped etching in a parallel plate-type plasma etching equipment (not shown). In the etching of the first step, a mixed gas of $C_4F_8$, $O_2$, and Ar is used as an etching gas, and the films from the second insulating film 55 to the first insulating film 45 are etched while using the cover insulating film 44 as an etching stopper film.

In the second step, a mixed gas of $O_2$ and Ar is used as an etching gas to remove etching products generated in the holes in the first step by sputtering effects of these gases.

Then, in the etching of the third step, a mixed gas of $C_4F_8$, $CF_4$, $O_2$, and Ar is used as an etching gas to etch the cover insulating film 44.

After the above-described etching is finished, the first resist pattern 57 is removed.

Next, processes for obtaining a cross-sectional structure shown in FIG. 3I will be described.

Firstly, a titanium (Ti) film and a titanium nitride (TiN) film with thicknesses of 20 nm and 50 nm, respectively, are formed by the sputtering method on inner surfaces of the first to fourth contact holes 58a to 58d and the upper surface of the second insulating film 55. These films are used as a glue film. After that, a tungsten film is formed on the glue film by the CVD method using a hexafluoride tungsten gas. The tungsten film completely fills the first to fourth contact holes 58a to 58d.

Thereafter, the excessive glue film and tungsten film on the second insulating film 55 are polished and removed by the CMP method to leave these films in the first to fourth contact holes 58a to 58d as first to fourth conductive plugs 60a to 60d, respectively.

Of these conductive plugs, the first to third conductive plugs 58a to 58c are electrically connected to the first to third source/drain regions 39a to 39c, respectively. In addition, the fourth conductive plug 39d is electrically connected to the wiring 36 thereunder.

The first to third conductive plugs 58a to 58c are mainly formed of tungsten, which is oxidized very easily. Accordingly, contact defect can possibly occur by the conductive plugs being easily oxidized in the atmosphere containing oxygen.

For this reason, to prevent oxidation of these first to fourth contact plugs 60a to 60d, a silicon oxynitride film as an oxidation preventive insulating film 61 is formed with a thickness of approximately 100 nm on the upper surfaces of these plugs and the second insulating film 55 by the CVD method.

Next, processes for obtaining a cross-sectional structure shown in FIG. 3J will be described.

Firstly, the oxidation preventive insulating film 61 is coated with a photoresist. The photoresist is exposed and developed to be made into a second resist pattern 63. As shown in the figure, hole-shaped fifth and sixth windows 63a and 63b are formed in the second resist pattern 63 over the upper electrodes 49a and the lower electrodes 47a.

Subsequently, while using the second resist pattern 63 as a mask, the oxidation preventive insulating film 61, the second insulating film 55, and the second and third alumina films 51 and 53 are etched to form first and second holes 55a and 55b over the upper electrodes 49a and the lower electrodes 47a, respectively.

Thereafter, to recover damages received in the capacitor dielectric film 48a during the processes described so far, the silicon substrate 30 is placed in the vertical furnace with the atmosphere containing oxygen to carry out the sixth recovery annealing on the capacitor dielectric film 48a, under conditions with a substrate temperature of 500° C. and a processing time of 60 minutes.

Then, after the second resist pattern 63 is removed, the oxidation preventive insulating film 61 is removed by etching back.

Figure 3K:
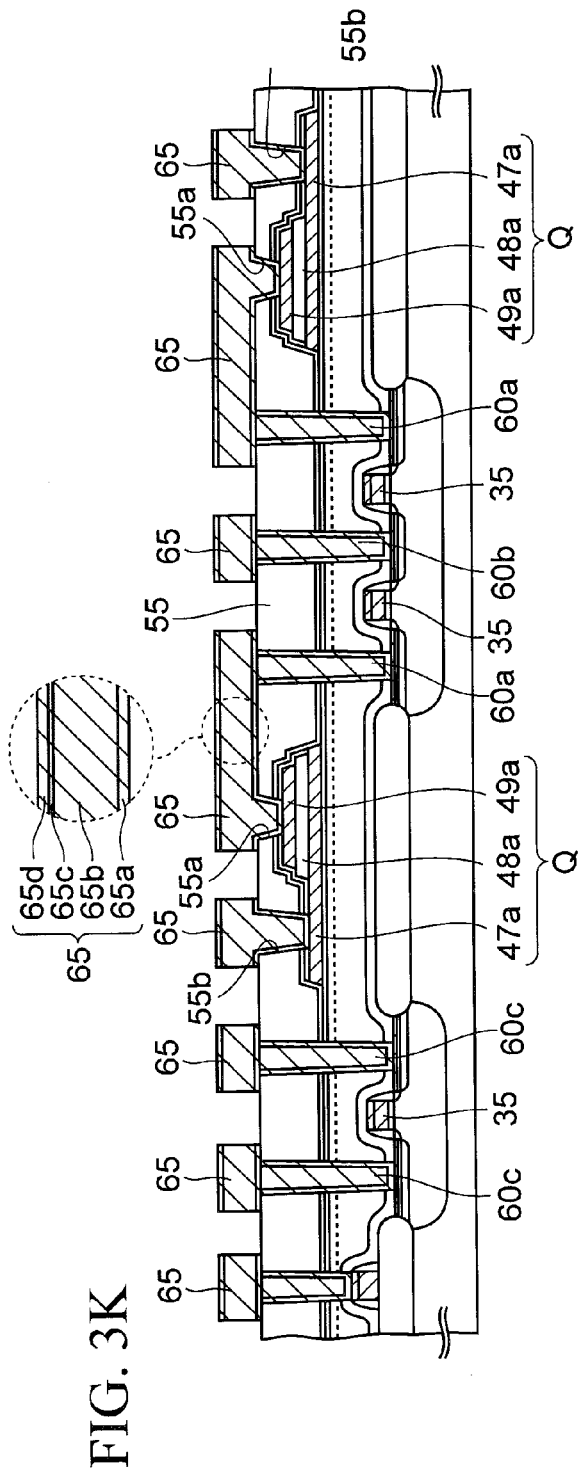

Next, processes for obtaining a cross-sectional structure shown in FIG. 3K will be described.

Firstly, a metal laminated film is formed, by the sputtering method, on upper surfaces of the second insulating film 55 and the first to fourth conductive plugs 60a to 60d and inner surfaces of the first and second holes 55a and 55b. In the present embodiment, the metal laminated film is formed by sequentially laminating a titanium nitride film 65a with a thickness of approximately 150 nm, a copper-containing aluminum film 65b with a thickness of approximately 550 nm, a titanium film 65c with a thickness of approximately 5 nm, and a titanium nitride film 65d with a thickness of approximately 150 nm.

Subsequently, this metal laminated film is patterned by photolithography to form first layer metal wirings 65 on the second insulating film 55. Of the first layer metal wirings 65, ones formed on the capacitors Q are electrically connected to the upper electrodes 49a and the lower electrodes 47a through the above-described first and second holes 55a and 55b, respectively.

Thereafter, the second insulating film 55 is annealed in a nitrogen atmosphere for dehydration under conditions with a substrate temperature of 350° C. and a processing time of 30 minutes.

Figure 3L:
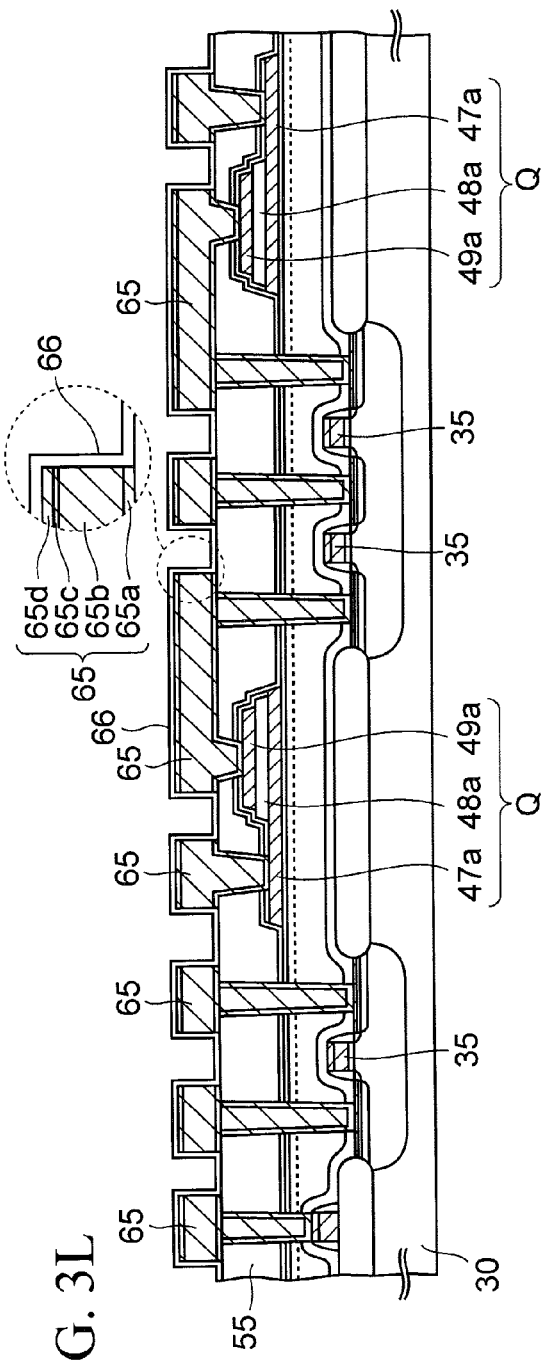
Figure 30:
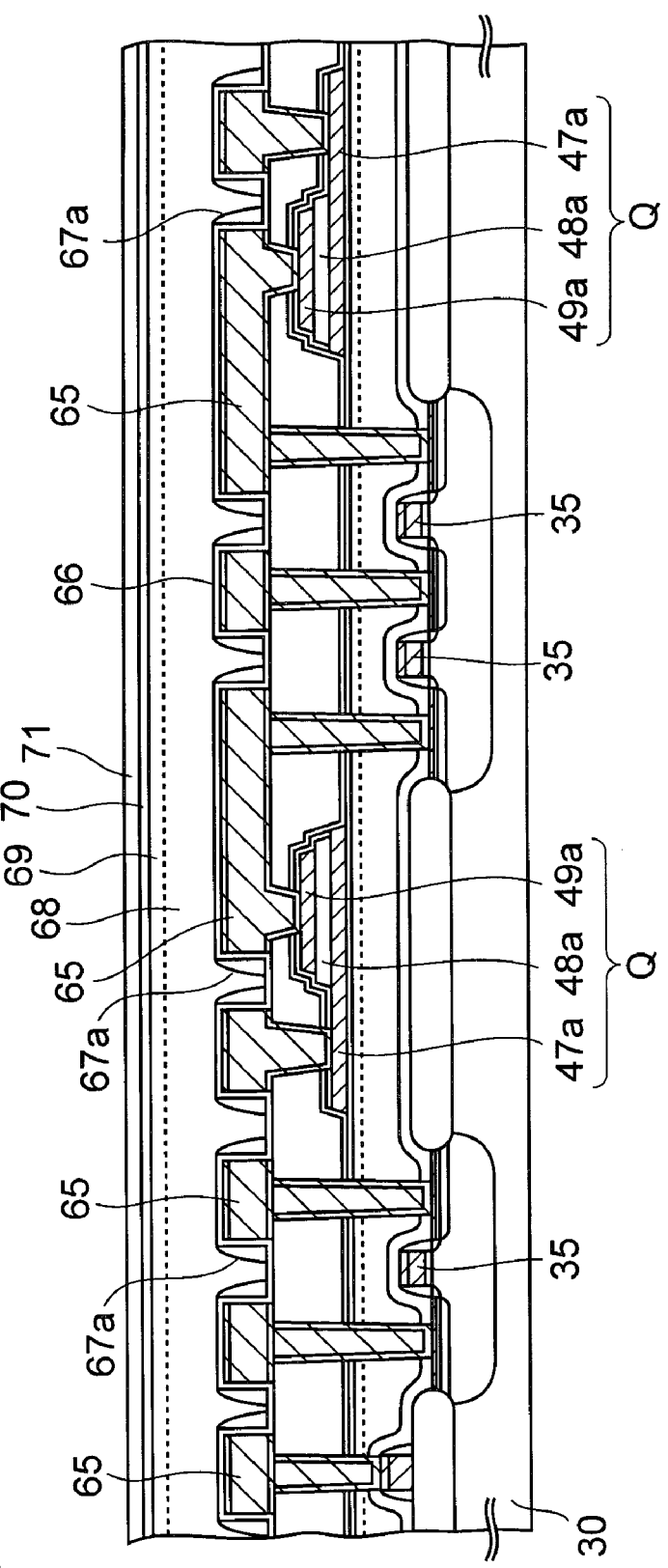

Next, as shown in FIG. 3L, an alumina film is formed by the sputtering method as a first capacitor protective insulating film 66 covering the first layer metal wirings 65 and the second insulating film 55.

This first capacitor protective insulating film 66 has a function of protecting the capacitor dielectric film 48a by blocking reductants, such as hydrogen and moisture, and also a function of reducing plasma damages received in the capacitor dielectric film 48a at the time when an insulating film is to be formed later on the first capacitor protective insulating film 66 by the plasma CVD method or the like. Of these functions, the function of blocking reductants can be sufficiently obtained even when the thickness of the first capacitor protective insulating film 66 is 100 nm or less. On the other hand, to reduce the plasma damages, the thickness of the first capacitor protective insulating film 66 is preferable to be at least 20 nm. From these reasons, it is preferable that the thickness of the first capacitor protective insulating film 66 be at least 20 nm but no more than 100 nm. In the present embodiment, the thickness of the first capacitor protective insulating film 66 is set to be approximately 20 nm.

Note that, according to the investigation that the inventors of the present application carried out, when substrate bias was set to be 0 at the time of forming the silicon oxide film directly on the first layer metal wirings 65 by the high density plasma CVD (HDCVD) method, the capacitors Q were hardly deteriorated. Thus, it is assumed that the above-described plasma damages become significant in the case where the substrate bias is applied in the plasma CVD method.

In addition, the first capacitor protective insulating film 66 also has a function of suppressing dissociation of water into hydrogen on a surface of the aluminum film 65b during the subsequent film-forming process. That is, the first capacitor protective insulating film 66 also has a function as a surface reaction preventive film.

The first capacitor protective insulating film 66 of the present embodiment is not limited to the alumina film as long as it has the above-described each function.

A silicon oxide film formed by a RF sputtering method has functions equivalent to those of an alumina film. This silicon oxide film may be formed as the first capacitor protective insulating film 66. In this case, the silicon oxide film is formed by setting power of high-frequency power (RF power) with a frequency of 13.56 MHz to be 2 kW, flow rates of Ar and $O_2$ gases as a sputtering gas to be respectively 18 sccm and 2 sccm, and a pressure in a sputtering chamber to be 1 Pa.

The silicon oxide film formed by the sputtering method in this manner has a low film density. Thus, it has a high hydroscopic property and is excellent in blocking reductants, such as moisture and hydrogen, when compared with a silicon oxide film formed by the CVD method or the like. Furthermore, the silicon oxide film also has an advantage that it can be processed more easily than the alumina film.

Next, as shown in FIG. 3M, a silicon oxynitride film is formed with a thickness of approximately 150 nm on the first capacitor protective insulating film 66 by the plasma CVD method using a silane ($SiH_4$) gas and an $N_2O$ gas as reaction gases. This silicon oxynitride film is used as a first sidewall insulating film 67. Note that in place of the silicon oxynitride film, a silicon nitride (SiN) film may be formed as a sidewall insulating film 67.

In this manner, even when the first sidewall insulating film 67 is formed by the plasma CVD method, the first capacitor protective insulating film 66 under the first sidewall insulating film 67 functions so as to absorb the plasma damages as described above. Thereby, plasma damages to be received in the capacitor dielectric film 48a through the first layer metal wirings 65 can be suppressed.

Moreover, since the side surfaces of the first layer metal wirings 65 are covered with the first capacitor protective insulating film 66, moisture contained in the film-forming atmosphere of the first sidewall insulating film 67 does not come in contact with the aluminum film 65b. Thus, by preventing moisture from generating hydrogen due to the reduction reaction of aluminum, it can be prevented that the capacitor dielectric film 48 is reduced by the generated hydrogen.

In addition, in place of the plasma CVD method, the first sidewall insulating film 67 may be formed by the sputtering method.

The plasma CVD method uses a gas containing hydrogen, such as $SiH_4$, as a reaction gas while heating the silicon substrate 30. Furthermore, bias voltage is easily applied to the silicon substrate 30. Accordingly, plasma damages are easily caused in the silicon substrate 30 in the plasma CVD method.

However, in the sputtering method, the substrate does not need to be heated. In addition, hydrogen is not contained in a target and a sputtering atmosphere, and sputtering equipment has a structure in which bias voltage is hardly applied to the silicon substrate 30. Accordingly, when the sputtering method is used, it is less likely to receive the plasma damages in the silicon substrate 30 when compared with the case of the plasma CVD method.

Consequently, by forming the first sidewall insulating film 67 by the sputtering method, it can be prevented that plasma damages are caused in the capacitor dielectric film 48a through the first layer metal wirings 65 which are electrically connected to the capacitors Q. Thereby, deterioration of the capacitor dielectric film 48a caused during the process can be suppressed.

Next, as shown in FIG. 3N, the first sidewall insulating film 67 is etched back to form first insulating sidewalls 67a on the first capacitor protective insulating film 66 beside the first layer metal wirings 65.

Conditions for this etching back are not particularly limited. In the present embodiment, a parallel plate-type plasma etching chamber (not shown) is used, and high-frequency power with a frequency of 13.56 MHz and power of 400 W is applied to a shower head which faces the silicon substrate 30. Then, as etching gases, $CHF_3$, $CF_4$, and Ar are supplied to the chamber with flow rates of 40 sccm, 80 sccm, and 1000 sccm, respectively. In addition, the inside of the chamber is depressurized to an extent of approximately 1700 m Torr by an unillustrated pump. Under these conditions, the above-described etching back is carried out.

Note that in this etching back, an end point of etching is monitored by an optical end point detector (EPD), and over etching is carried out by an extent of 10 to 20% in a film thickness equivalent value. For example, in the case where the thickness of the sidewall insulating film 67 is 100 nm, a time required for just etching is approximately 30 seconds, and a time required for over etching is approximately 5 seconds.

Next, processes for obtaining a cross-sectional structure shown in FIG. 3O will be described.

Firstly, a silicon oxide film is formed on the first capacitor protective insulating film 66 and the first insulating sidewalls 67a by the plasma CVD method using the TEOS gas. This silicon oxide film thus formed is used as a third insulating film 68. Note that a film thickness of this third insulating film 68 is not particularly limited. In the present embodiment, the thickness of the third insulating film 68 on the first layer metal wirings 65 is set to be approximately 2600 nm.

Thereafter, the upper surface of the third insulating film 68 is polished and planarized by the CMP method. By this CMP, the thickness of the third insulating film 68 is reduced to approximately 1000 nm on the first layer metal wirings 65.

Subsequently, the surface of the third insulating film 68 is nitrided by exposing the third insulating film 68 to $N_2O$ plasmas under conditions with a substrate temperature of approximately 350° C. and a processing time of approximately 4 minutes.

Then, by employing the plasma CVD using the TEOS gas again, a silicon oxide film as a second cap insulating film 69 is formed with a thickness of approximately 100 nm on the third insulating film 68.

Thereafter, the $N_2O$ plasma processing is carried out again to nitride a surface of the second cap insulating film 69. In this $N_2O$ plasma processing, a substrate temperature of 350° C. and a processing time of 2 minutes are employed, for example.

Next, an alumina film which is excellent in blocking reductants such as moisture and hydrogen, which are contained in an external atmosphere, is formed with a thickness of approximately 50 nm on the second cap insulating film 69 by the sputtering method. This alumina film is formed in order to prevent above reductants from coming into contact with the capacitor dielectric film 48a. This alumina film is used as a second capacitor protective film 70.

Subsequently, by the plasma CVD method using the TEOS gas, a silicon oxide film is formed on the second capacitor protective insulating film 70 as a third cap insulating film 71. The thickness of the third cap insulating film 71 is, for example, approximately 100 nm.

Thereafter, a surface of this third cap insulating film 71 is nitride by carrying out $N_2O$ plasma processing on the third cap insulating film 71 under conditions with a substrate temperature of 350° C. and a processing time of 2 minutes.

Next, processes for obtaining a cross-sectional structure shown in FIG. 3P will be described.

Firstly, the third cap insulating film 71 is coated with a photoresist. The photoresist is exposed and developed to form a third resist pattern 73 provided with hole-shaped seventh windows 73a over the first layer metal wirings 65.

Subsequently, the silicon substrate 30 is placed in a parallel plate-type plasma etching chamber (not shown) in which an upper electrode and a lower electrode are provided so as to be opposed to each other, and the silicon substrate 30 is loaded on the lower electrode. Then, the chamber is evacuated by an unillustrated pump while supplying $C_4F_8$, Ar, and $O_2$ with flow rates of 20 sccm, 500 sccm, and 12 sccm respectively, to the chamber as etching gases, so that a pressure of the etching gas is set to be approximately 50 m Torr. In this state, high-frequency power (source power) with a frequency of 27.12 MHz and power of 2000 W is applied to the upper electrode in the chamber. In addition, high-frequency power (bias power) with a frequency of 800 kHz and power of 900 W is applied to the lower electrode in the chamber. Thereby, the etching gases are caused to be plasma, and the inside of the chamber is to be filled with an etching atmosphere.

In such an etching atmosphere, the etching rate of the first insulating sidewall 67a made of silicon oxynitride becomes lower than that of the third insulating film 68 made of silicon oxide.

After that, by maintaining the above state for approximately 185 seconds, the insulating films 66 and 68 to 71 under the seventh windows 73a are etched by the above-described etching atmosphere. Thereby, third holes 74a are formed on the first layer metal wirings 65.

After this etching is finished, the third resist pattern 73 is removed, and inner surfaces of the third holes 74a are cleaned by cleaning water.

Figure 3P:
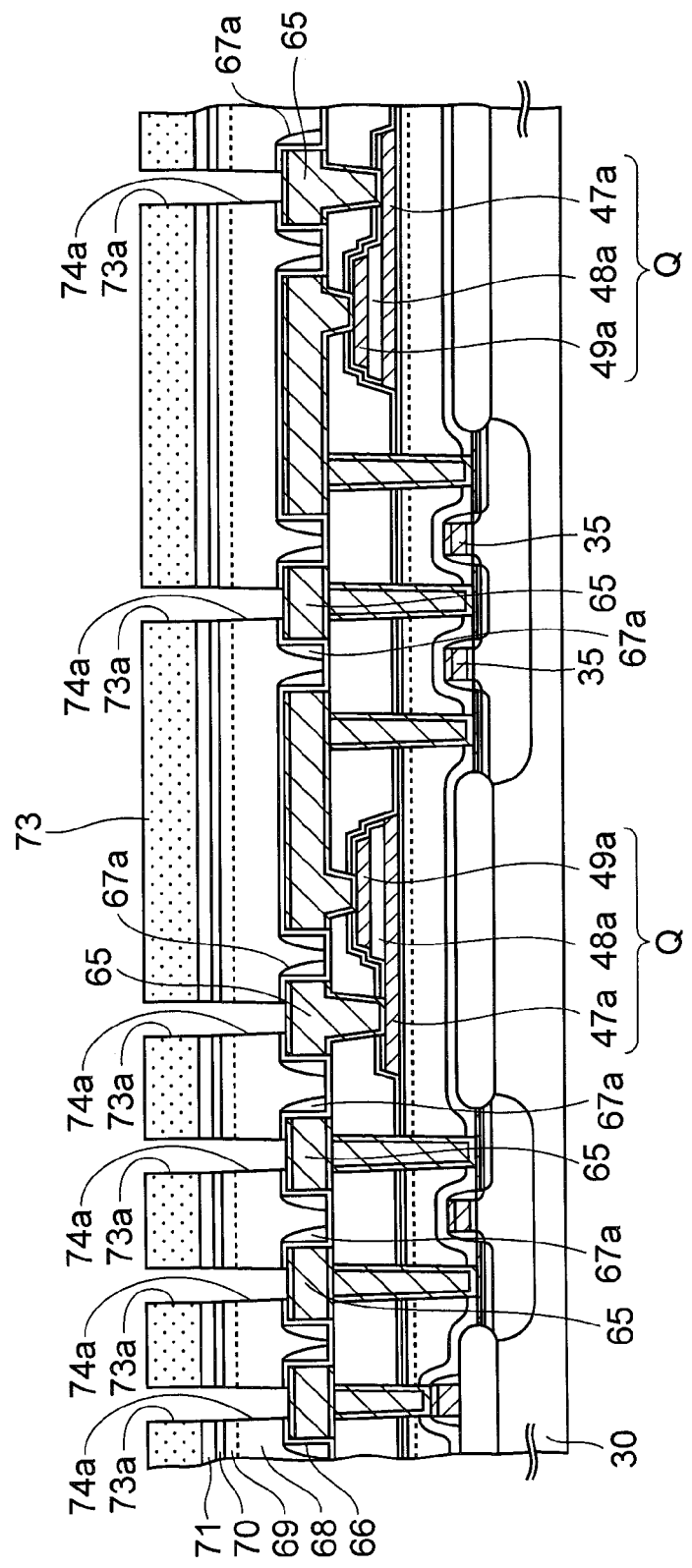

Incidentally, FIG. 3P shows a state where the third holes 74a and the first layer metal wirings 65 are aligned as desired. However, there is a case where, for example, one portion of the third holes 74a is displaced from the first layer metal wirings 65 due to misalignment of the third resist pattern 73.

Figure 4:
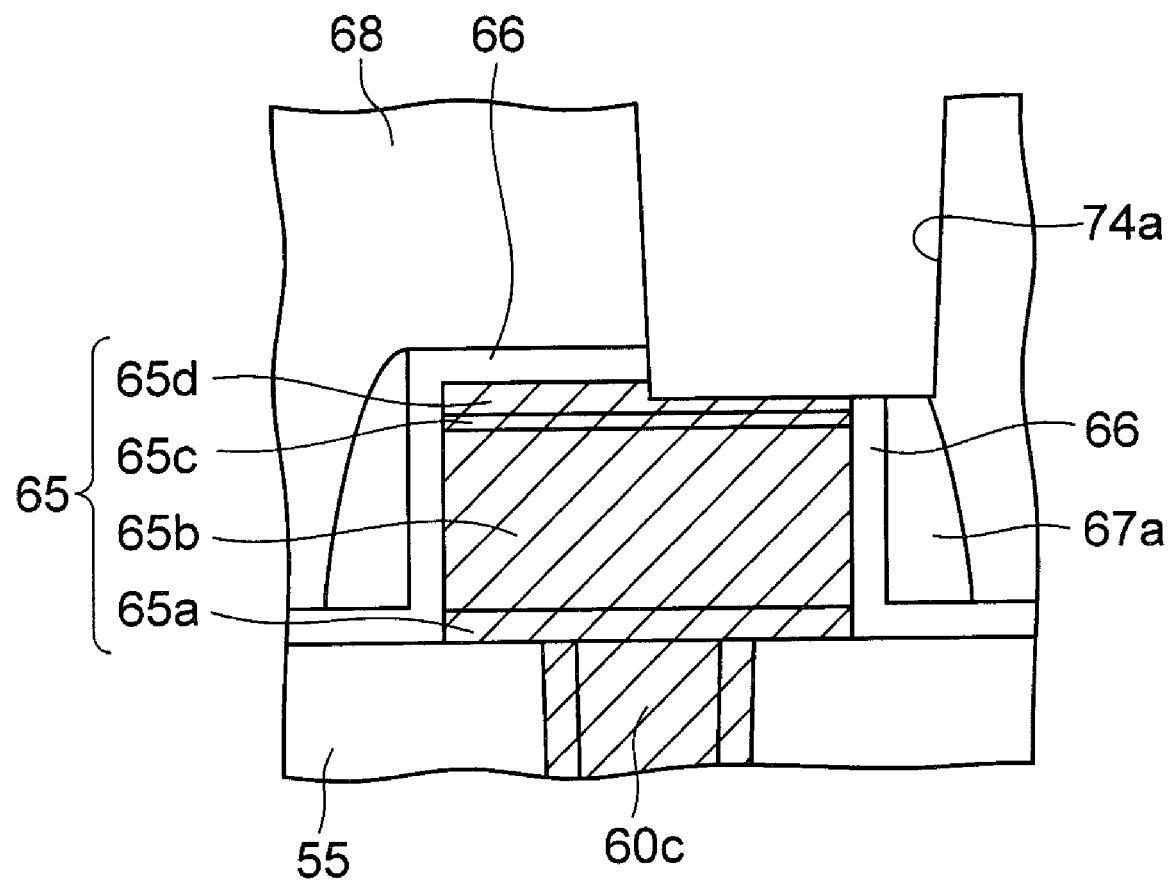
FIG. 4 is an enlarged cross-sectional view showing the case where one portion of a third hole 74a is displaced from a first layer metal wiring 65 in the first embodiment.

FIG. 4 is an enlarged cross-sectional view in the case where one portion of the third hole 74a is displaced from the first layer metal wiring 65 in this manner.

As described above, in the present embodiment, the first insulating sidewalls 67a are formed beside the first layer metal wirings 65. In addition, the third holes 74a are formed under the etching condition that the etching rate of the first insulating sidewall 67a becomes lower than that of the second insulating film 68. Accordingly, as shown in the figure, even when one portion of the third hole 74a is displaced from the first layer metal wiring 65 and overlaps with the first insulating sidewall 67a, the etching is absorbed in the first insulating sidewall 67a. Thus, a groove described in the preliminary explanation is not formed.

Therefore, even after the etching is finished, etching products, which are generated from the first and second capacitor protective insulating films 66 and 70 made of alumina, and which are poor in reactivity and thus difficult to be removed, are hardly stuck in the third hole 74a.

Furthermore, even when the inner surface of the third hole 74a is cleaned by cleaning water after the etching, water is hardly stuck in the third hole 74a.

Note that in this etching, etching selectivity between the titanium nitride film 65d, which is the uppermost film of the first layer metal wiring 65, and the first capacitor protective insulating film 66 decrease as the film thickness of the first capacitor protective insulating film 66 made of alumina or of the second cap insulating film 69 becomes thicker, so that substances generated from the titanium nitride film 65d increase in the etching products. The etching products containing titanium nitride is preferable to be reduced as much as possible because they remain residual in the third hole 74a to cause contact defect. For this reason, in the case where the thickness of the first capacitor protective insulating film 66 or of the second cap insulating film 69 is set to be thicker than that of the present embodiment (that is, the thicknesses of the first capacitor protective insulating film and the second cap insulating film 69 are approximately 20 nm and 50 nm, respectively), it is preferable that an etching time be set to be shorter than 185 seconds so as not to generate the etching products as much as possible.

In addition, when a silicon oxide film, which can be more easily processed than an alumina film, is formed as the first capacitor protective insulating film 66 by the sputtering method, it becomes easy to open the first capacitor protective insulating film 66 by etching at the time of forming the third hole 74a. Thereby, increase in processing accuracy of the third hole 74a can be obtained.

Figure 3Q:
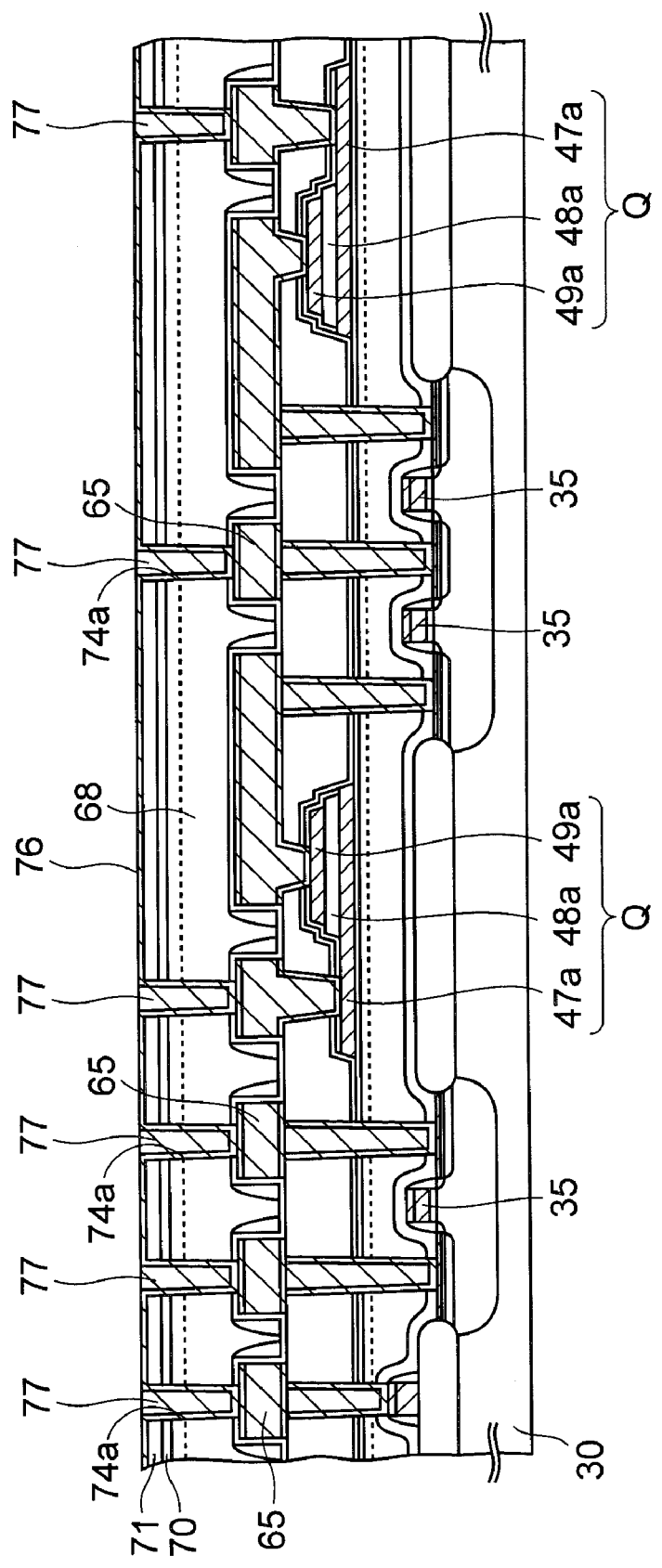

Next, processes for obtaining a cross-sectional structure shown in FIG. 3Q will be described.

Firstly, in order to avoid degassing from the third insulating film 68 into the third holes 74a, the inner surfaces of the third holes 74a are nitrided. The nitride processing is carried out in a nitrogen atmosphere, for example, under conditions with a substrate temperature of 350° C., a flow rate of a nitrogen gas of 20 litters per minute, and a processing time of 120 minutes.

Subsequently, the first layer metal wirings 65 under the third holes 74a are lightly etched by exposing to an argon plasma atmosphere, so that the surfaces of the first layer metal wirings 65 are cleaned. An etching amount at this time is, for example, 50 nm.

Then, a titanium nitride film is formed with a thickness of approximately 150 nm on the inner surfaces of the third holes 74a and the upper surface of the third cap insulating film 71 by the sputtering method. The titanium nitride film thus formed is used as a first glue film 76.

Subsequently, by the plasma CVD method using a hexafluoride tungsten gas, a tungsten film with a thickness that can completely fill the third holes 74a, for example, a thickness of 650 nm, is formed on the first glue film 76. Thereafter, this tungsten film is etched back and removed from the upper surface of the third cap insulating film 71, and is left only in the third holes 74a. Thereby, fifth conductive plugs 77, which are made of tungsten and electrically connected to the first layer metal wirings 65, are formed in the third holes 74a.

Note that in this example, the tungsten film is etched back, but CMP may be employed in place of the etch back.

Here, as described in FIG. 4, foreign materials, such as etching products and cleaning water, are not stuck in the third holes 74a. Accordingly, when the above-described tungsten film is formed in the third holes 74a, degassing caused by the foreign materials is not generated even when the silicon substrate 30 is heated. Thus, the third holes 74a can be preferably embedded by the tungsten film. As a result, the inconvenience that the fifth conductive plugs 77 are not formed as described in the preliminary explanation is not caused. Therefore, contact resistance of the fifth conductive plugs 77 is not lowered. Thus, the fifth conductive plugs 77 and the first layer metal wirings 65 can be electrically securely connected.

Figure 3R:
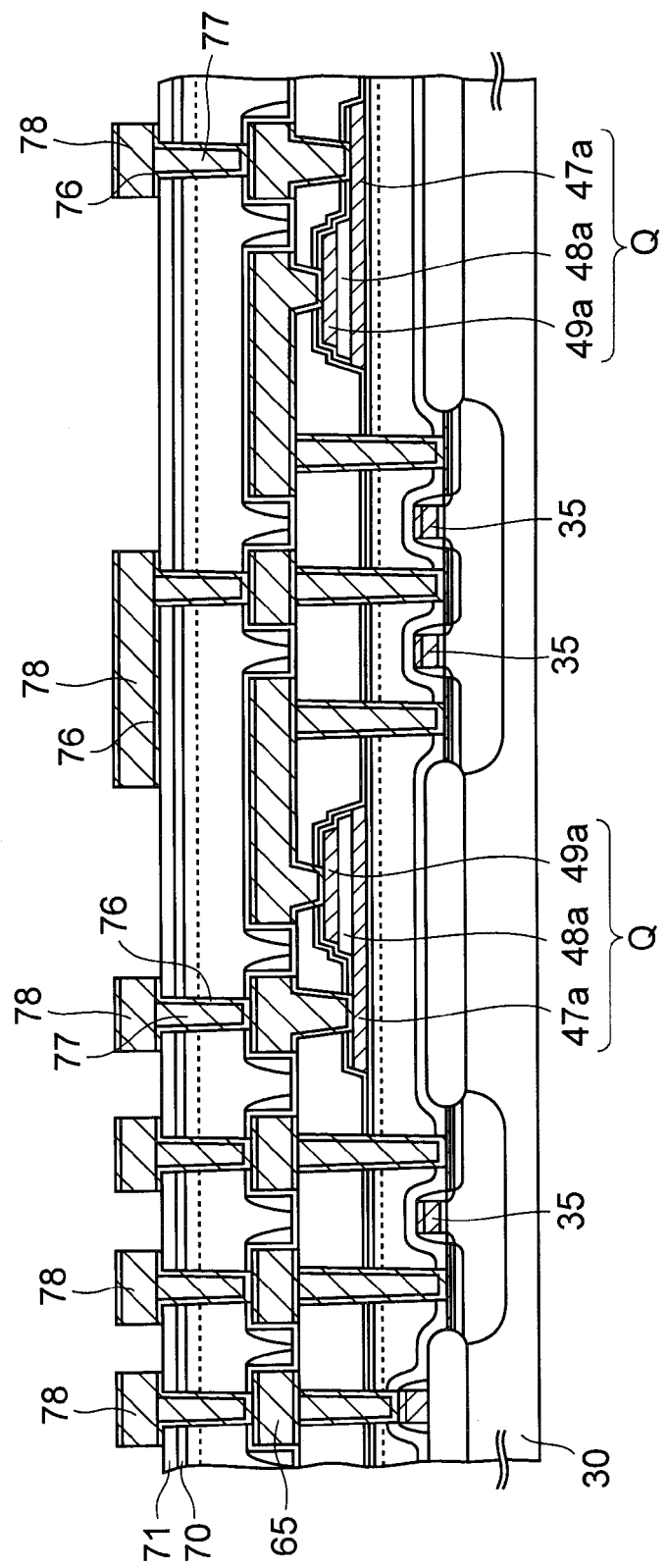

Next, processes for obtaining a cross-sectional structure shown in FIG. 3R will be described.

Firstly, a metal laminated film is formed on the upper surfaces of the fifth conductive plugs 55 and the first glue film 76 by the sputtering method. The metal laminated film is formed by laminating, for example, from the lower side, a copper-containing aluminum film with a thickness of approximately 550 nm, a titanium film with a thickness of approximately 5 nm, and a titanium nitride film with a thickness of approximately 150 nm.

Thereafter, this metal laminated film and the first glue film 76 are patterned by photolithography to form second layer metal wirings 78 constructed from these films on the third cap insulating film 71.

Note that as described above, the first capacitor protective insulating film 66 is formed on the first layer metal wirings 65 so that plasma damages are prevented from reaching the capacitors Q through the first layer metal wirings 65. In contrast, the second layer metal wirings 78 are far from the capacitors Q. Accordingly, deterioration of the capacitors Q is hardly caused by the plasma damages even when the capacitor protective insulating film made of alumina is not formed on the second layer metal wirings 78. In addition, even when film formation is carried out on the second layer metal wirings 78 by the plasma CVD, which results in generating hydrogen due to dissociation of water generated at the time of the film formation on a side surface of the above-described aluminum film, the hydrogen hardly reaches the capacitors Q. This is because the second layer metal wirings 78 are far from the capacitors Q, and hydrogen is blocked by the first and second capacitor protective insulating films 66 and 70.

Figure 3S:
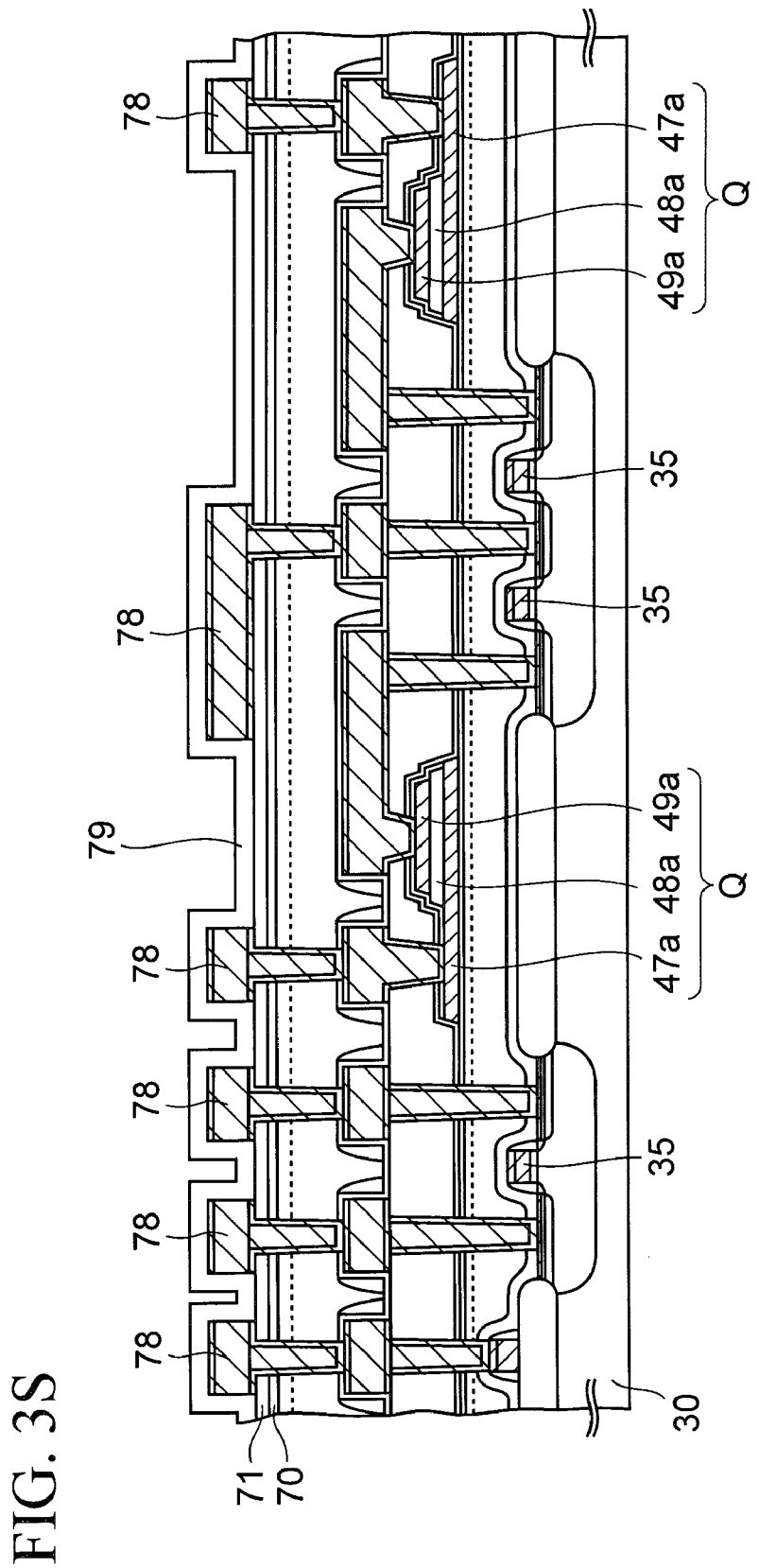

Next, as shown in FIG. 3S, a silicon oxynitride film as a second sidewall insulating film 79 is formed with a thickness of approximately 150 nm on the second layer metal wirings 78 and the third cap insulating film 71 by the plasma CVD method. Note that the second sidewall insulating film 79 is not limited to a silicon oxynitride film. The second sidewall insulating film 79 may be a silicon nitride film.

In addition, like the first sidewall insulating film 67 (see FIG. 3M), the second sidewall insulating film 79 may be formed by the sputtering method, so that plasma damages to be received in the capacitor dielectric film 48a through the second layer metal wirings 78, which are electrically connected to the capacitors Q, can be reduced.

Figure 3T:
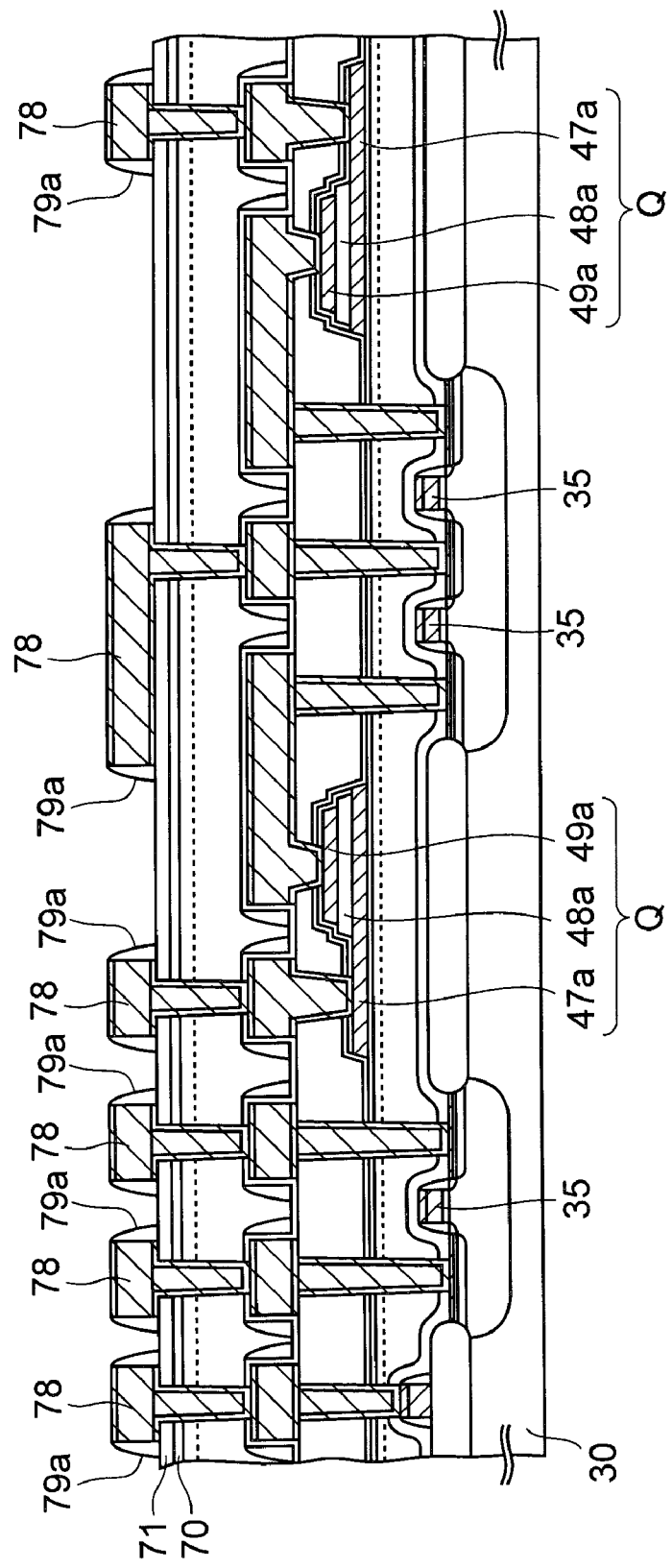

Next, as shown in FIG. 3T, the second sidewall insulating film 79 is etched back to be left as second insulating sidewalls 79a beside the second layer metal wirings 78. Note that as for conditions for this etching back, conditions same as those of the etching back of the first sidewall insulating film 67 described in FIG. 3N are employed.

Figure 3U:
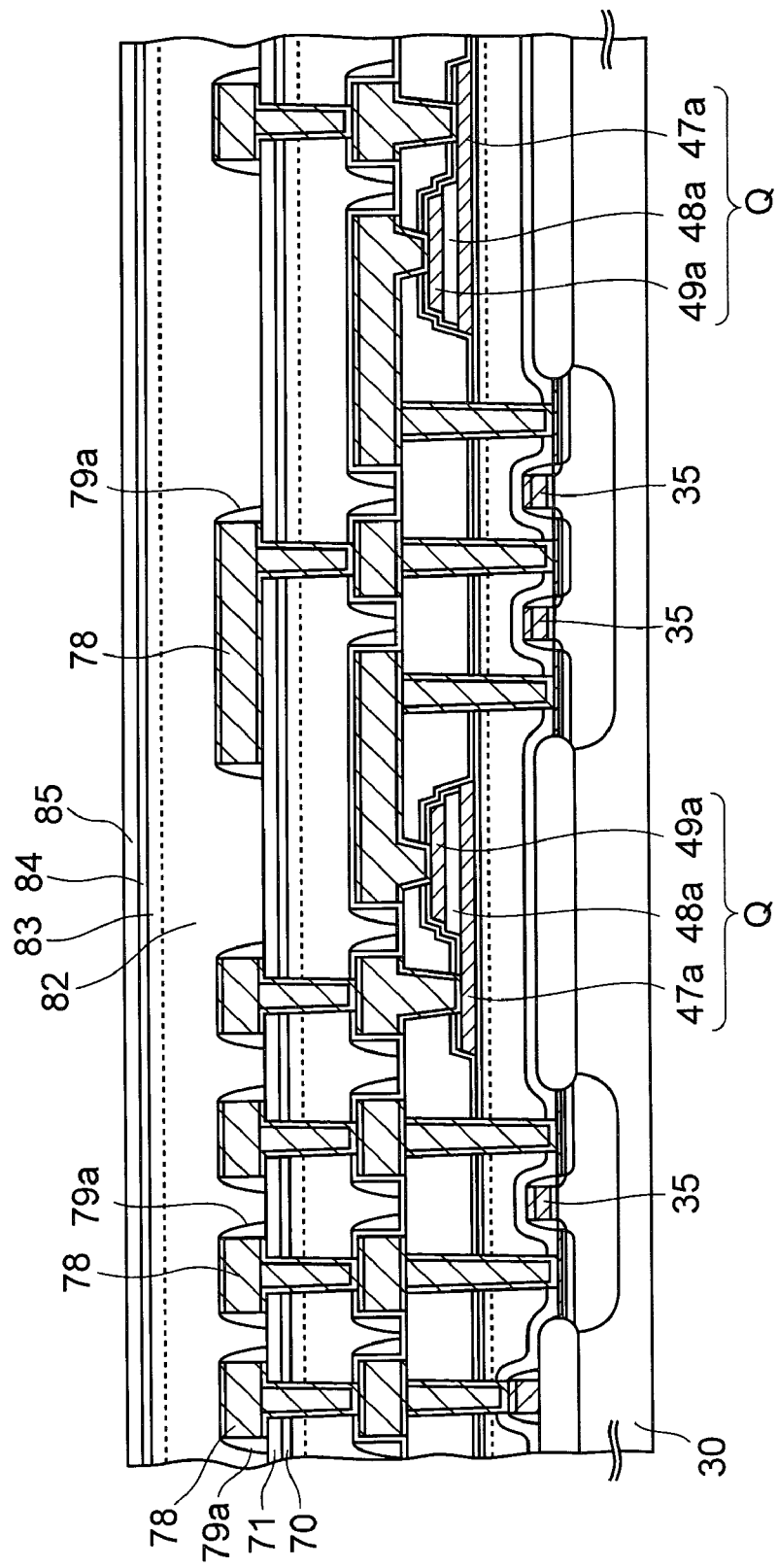

Next, as shown in FIG. 3U, a silicon oxide film is formed with a thickness of approximately 2200 nm on the entire upper surface of the silicon substrate 30 by the plasma CVD method using the TEOS gas. This silicon oxide film is used as a fourth insulating film 82. Then, after the upper surface of the fourth insulating film 82 is planarized by the CMP method, a silicon oxide film as a third cap insulating film 83 is further formed with a thickness of approximately 100 nm on the fourth insulating film 82.

Then, an alumina film as a third capacitor protective insulating film 84 for protecting the capacitor dielectric film 48a from reductants is formed with a thickness of approximately 50 nm on the third cap insulating film 83 by the sputtering method.

Thereafter, a silicon oxide film is formed with a thickness of approximately 100 nm on the third capacitor protective insulating film 84 by the plasma CVD method using the TEOS gas. This silicon oxide film is used a fourth cap insulating film 85.

Figure 3V:
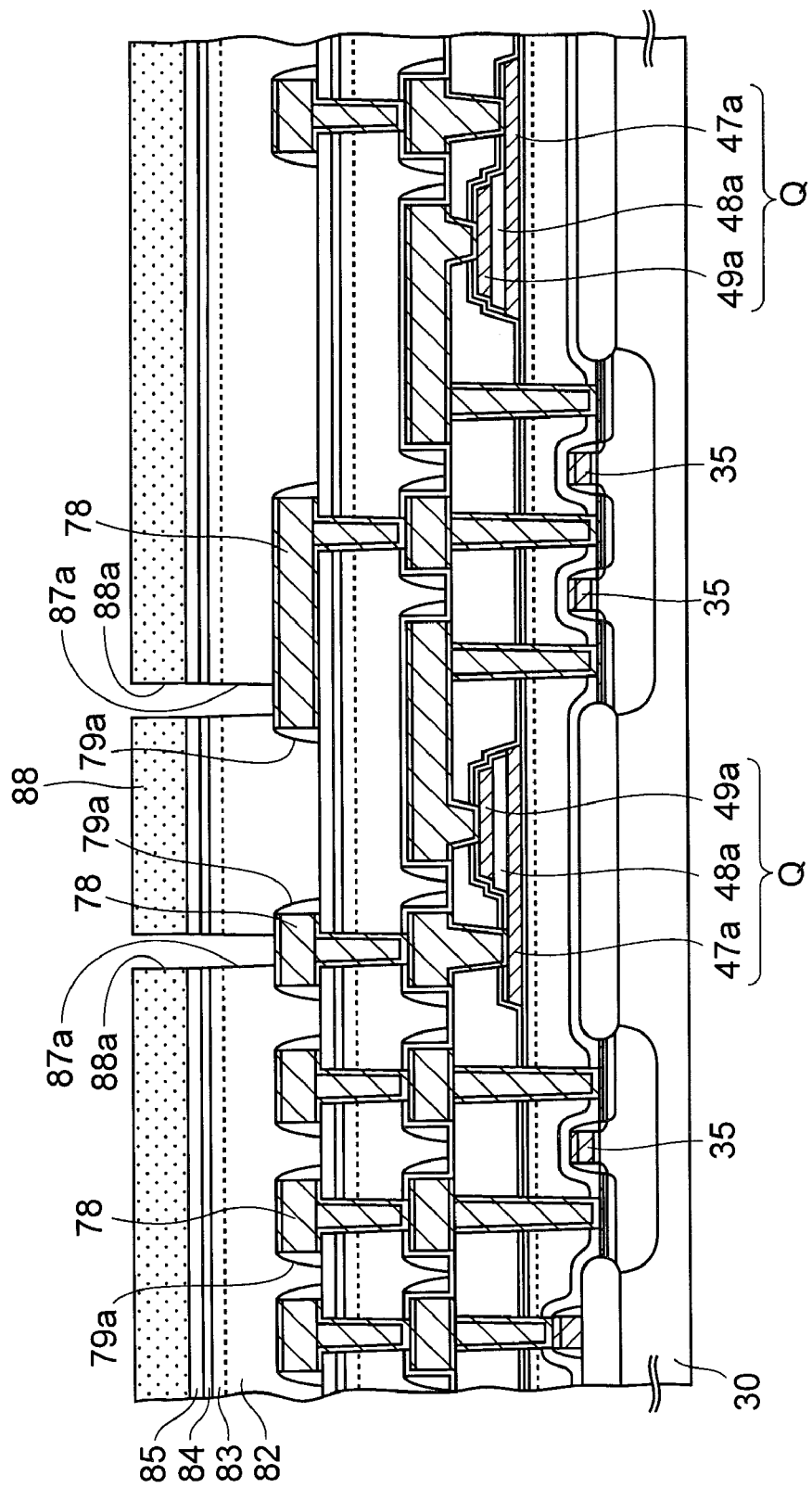

Next, processes for obtaining a cross-sectional structure shown in FIG. 3V will be described.

Firstly, the fourth cap insulating film 85 is coated with a photoresist. The photoresist is exposed and developed to form a fourth resist pattern 88 provided with hole-shaped eighth windows 88a over the second layer metal wirings 78.

Subsequently, in a parallel plate-type plasma etching chamber, the insulating films 82 to 85 are etched while using the fourth resist pattern 88 as a mask, so that fourth holes 87a are formed in these films over the second layer metal wirings 78.

Conditions for this etching are not particularly limited. In the present embodiment, high-frequency power (source power) with a frequency of 27.12 MHz and power of 2000 W is applied to the upper electrode in the chamber and high-frequency power (bias power) with a frequency of 800 kHz and power of 900 W is applied to the lower electrode in the chamber. After that, $C_4F_8$, Ar, and $O_2$ with flow rates of 20 sccm, 500 sccm, and 12 sccm, respectively, are supplied to the etching chamber to stabilize the pressure in the chamber at approximately 50 mTorr. An etching time is set to be approximately 190 seconds.

With such etching conditions, the etching rate of the silicon oxynitride film becomes lower than that of the silicon oxide film.

Accordingly, even when the fourth holes 87a are misaligned and one portion thereof overlaps with the second insulating sidewalls 79a, the etching is absorbed in the second insulating sidewall 79a made of silicon oxynitride. Thus, a groove as described in the preliminary explanation is not formed in the bottom of the fourth holes 87a. Consequently, it is made possible that etching products, which are generated at the time of etching the third capacitor protective insulating film 84 made of alumina and are difficult to be removed, and cleaning water, which is used when the inner surfaces of the fourth holes 87a are cleaned, are hardly stuck in the fourth holes 87a.

After this etching is finished, the fourth resist pattern 88 is removed.

Figure 3W:
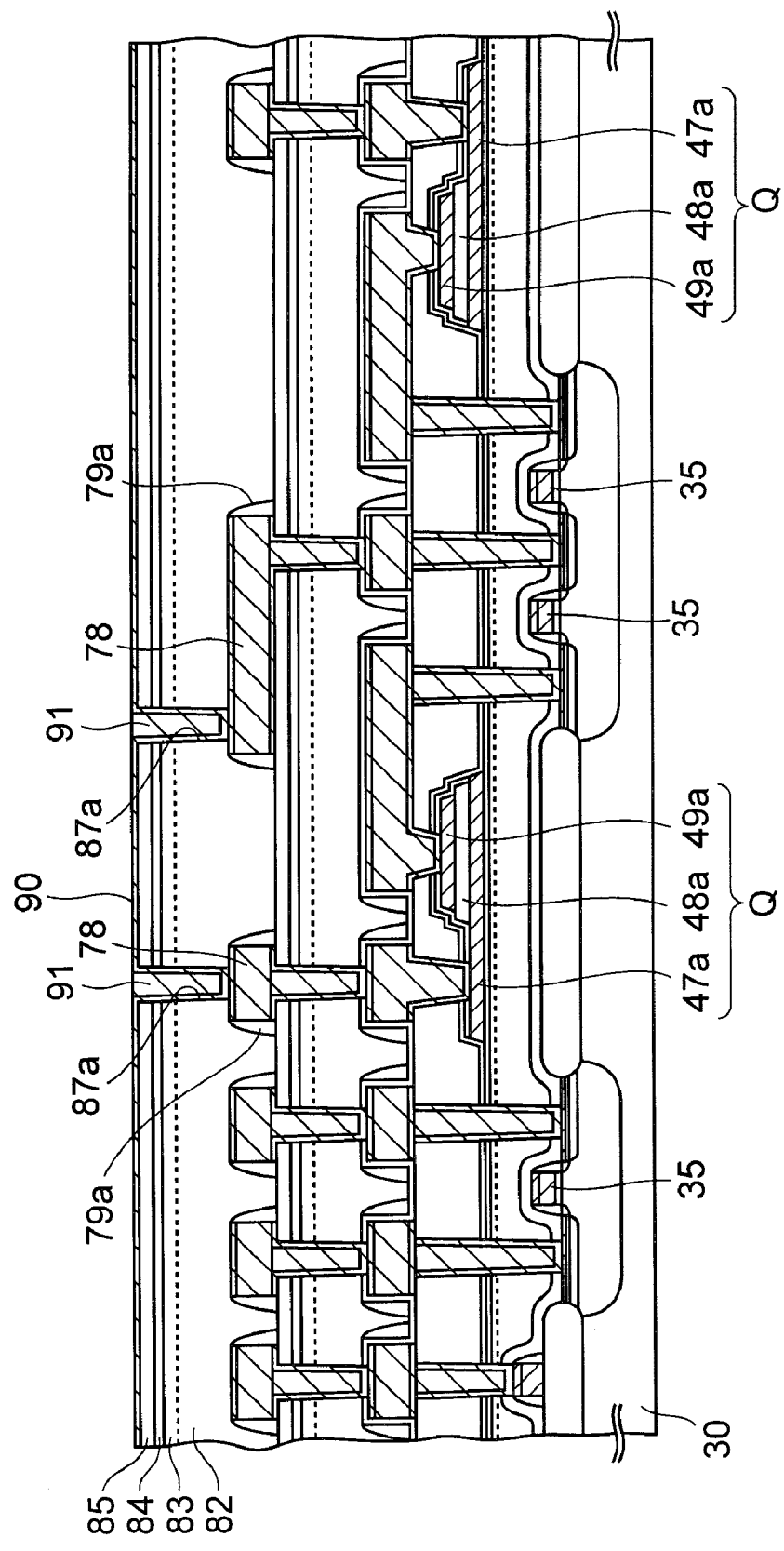

Next, as shown in FIG. 3W, a titanium nitride film as a second glue film 90 is formed, by the sputtering method, with a thickness of approximately 150 nm on the inner surfaces of the fourth holes 87a and the upper surface of the fourth cap insulating film 85. After that, a tungsten film is formed on the second glue film 90 by the CVD method. The fourth holes 87a are completely embedded by this tungsten film. Then, the excessive tungsten film on the fourth cap insulating film 85 is polished and removed by the CMP method to leave the tungsten film only in the fourth holes 87a as sixth conductive plugs 91.

As described above, there are no foreign materials, such as etching products containing alumina and cleaning water, in the fourth holes 87a. Thus, even when the silicon substrate 30 is heated at the time of forming the tungsten film, degassing caused by the foreign materials is not generated in the fourth holes 87a. Accordingly, the tungsten film can be preferably formed in the fourth holes 87a. Thereby, an inconvenience that the sixth conductive plugs 91 are not formed can be prevented.

Figure 3X:
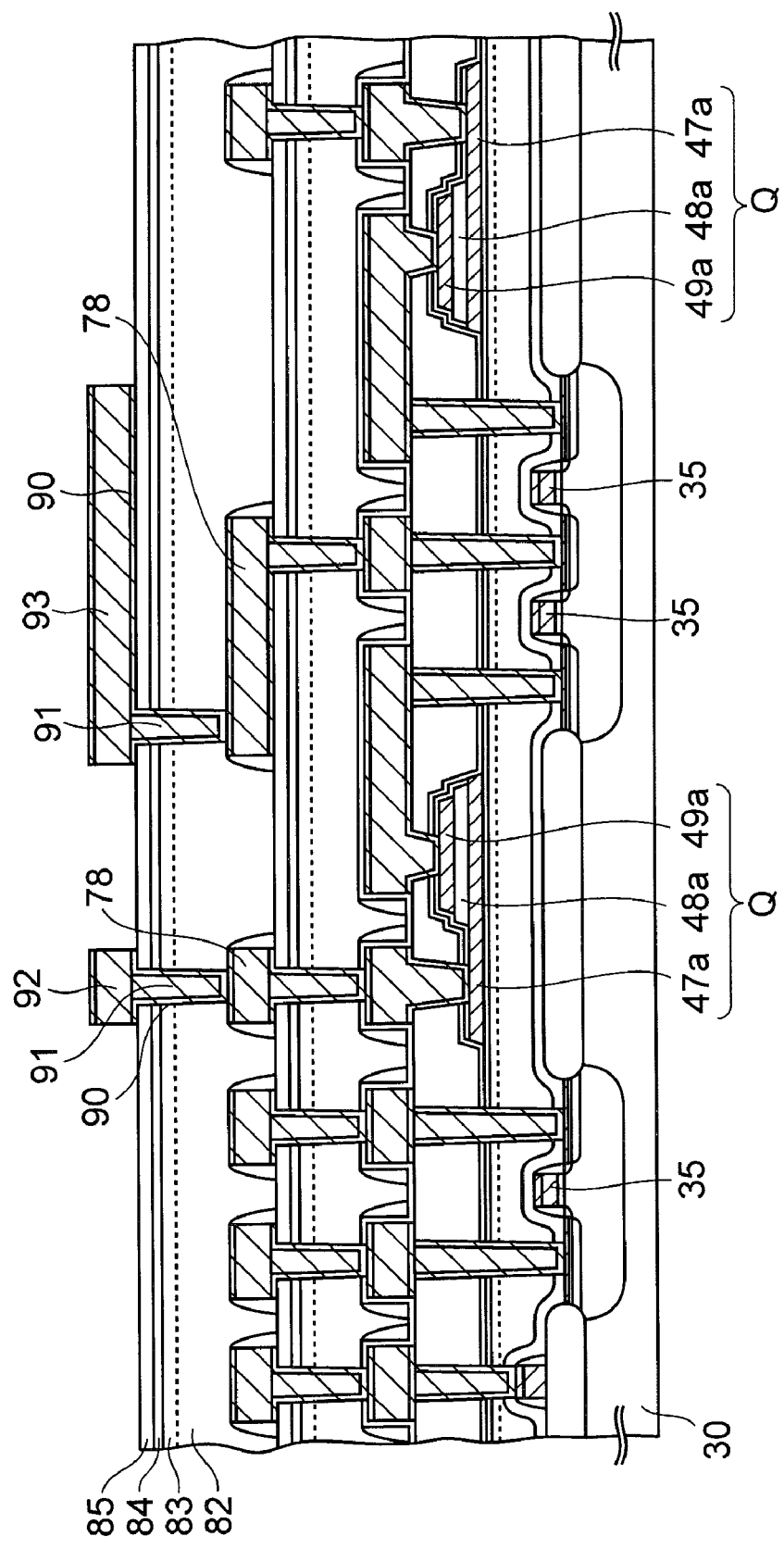

Next, processes for obtaining a cross-sectional structure shown in FIG. 3X will be described.

Firstly, a copper-containing aluminum film with a thickness of approximately 550 nm, a titanium film with a thickness of approximately 5 nm, and a titanium nitride film with a thickness of approximately 150 nm are formed in this order, from the lower side, on the upper surfaces of second glue film 90 and the sixth conductive plugs 91 by the sputtering method. After that, this metal laminated film and the second glue film 90 thereunder are patterned by photolithography to form a third layer metal wiring 92 and a bonding pad 93 on the fourth cap insulating film 85.

Next, as shown in FIG. 3Y, a silicon oxide film as a first cover film 95 is formed with a thickness of approximately 100 nm on the third layer metal wiring 92 and on the bonding pad 93 by the CVD method. Furthermore, a silicon nitride film as a second cover film 96 is formed with a thickness of approximately 350 nm on this first cover film 95 by the CVD method.

Subsequently, the first and second cover films 95 and 96 are patterned by photolithography. Thereby, an opening 95a to which the bonding pad 93 is exposed is formed in the insulating films 95 and 96.

Thereafter, the entire upper surface of the silicon substrate 30 is coated with polyimide by a spin-coat method. Then, the step proceeds to the process of forming a protective layer formed of polyimide, but detailed description thereof will be omitted.

With the processes described so far, the basic structure of the semiconductor device according to the present embodiment is completed.

According to the present embodiment, as shown in FIG. 4, the first layer metal wiring 65 is covered with the first capacitor protective insulating film 66, and thereafter, the first insulating sidewalls 67a and the third insulating film 68 are formed. Thereby, the first layer metal wiring 65 is not directly exposed to plasmas contained in the film-forming atmosphere of the first insulating sidewalls 67a and the third insulating film 68. Thus, the plasma damages received in the capacitor dielectric film 48a (see FIG. 3O) through the first layer metal wiring 65 can be reduced. Consequently, the capacitor Q provided with the capacitor dielectric film 48a, which is excellent in ferroelectricity, can be formed.

In contrast, in the above-described patent documents 1 to 6, 8, and 9, a film corresponding to the first capacitor protective insulating film 66 is not formed, and insulating sidewalls are directly formed on side surfaces of wirings. Thus, plasma damages cannot be reduced as described above, which results in deterioration of the capacitor dielectric film 48a. In addition, in the patent document 7, the sidewalls are formed of a conductive film. Accordingly, a distance between the adjacent wirings is shortened by the sidewalls, and a parasitic capacitance between the wirings increases, which causes a disadvantage in providing a device with a higher speed.

Moreover, in the present embodiment, the first sidewall insulating film 67 is constructed from the silicon oxynitride film or the silicon nitride film, which is easily etched back. Accordingly, the first insulating sidewalls 67a can be easily formed when compared with the patent document 2 in which sidewalls are constructed from alumina, which is difficult to be etched back.

Furthermore, in the present embodiment, as described in FIG. 4, the third insulating film 68 on the first layer metal wiring 65 is etched to form the third hole 74a, under the condition where the etching rate of the first insulating sidewalls 67a becomes lower than that of the third insulating film 68.

Thereby, even when the third hole 74a is misaligned and one portion thereof overlaps with the first insulating sidewalls 67a, the etching at the time of forming the third hole 74a is absorbed in the first insulating sidewalls 67a. Accordingly, a groove is not formed in the bottom of the third hole 74a. For this reason, foreign materials, such as etching products containing alumina, which is difficult to be chemically removed, and cleaning water, do not enter the groove. Thus, it becomes possible to avoid inconveniences such that a fifth conductive plug 77 is not formed due to these foreign materials or that contact resistance of the fifth conductive plug 77 is increased.

The following table 1 shows investigating results that the inventors of the present application carried out to confirm effects of the first insulating sidewalls 67a.

TABLE 1

| | Misalignment amount of third hole 74a | Thickness of capacitor protective insulating film [nm] | | The number of fifth conductive plugs 77 unformed |
|---|---|---|---|---|
| | | First capacitor protective insulating film 66 | Second capacitor protective insulating film 70 | |
| 1 | average 130 nm | 20 | 20 | 67 |
| 2 | | 30 | | 66 |
| 3 | | 40 | | 8 |
| 4 | | 50 | | 1 |
| 5 | | 60 | | 2 |

In the sample used for this investigation, the first insulating sidewall 67a was not formed. Instead of forming the first insulating sidewall 67a, the first capacitor protective insulating film 66 was thickly formed so that the first capacitor protective insulating film 66 on the side surface of the first layer metal wirings 65 functioned as an etching stopper.

In addition, in this investigation, the third hole 74a was intentionally misaligned so that an average misalignment amount would be 130 nm in the silicon substrate 30 of 6 inches. Then, an optical defect detector was used to investigate how many fifth conductive plugs 77 were unformed in the surface of the substrate 30.

As shown in table 1, in the case where the thickness of the first capacitor protective insulating film 66 was 20 nm (condition 1), there were as many as 67 defects in the surface of the silicon substrate 30.

However, when the thickness of the first capacitor protective insulating film 66 was increased to 50 nm (condition 4), the number of the defects reduced to 1. Furthermore, when the thickness of the first capacitor protective insulating film 66 was set to 60 nm (condition 5), the number of the defects were 2.

From these results, it becomes apparent that the thicker the first capacitor protective insulating film is, the fewer the number of defects are.

The possible reason for this is because when the capacitor protective insulating film 66 is thickened, the first capacitor protective insulating film 66 on the side surfaces of the first layer metal wiring 65 functions as an etching stopper, like the first insulating sidewalls 67a, and thus a groove is not formed in the third hole 74a in a portion where it is displaced from the first layer metal wiring 65. Accordingly, it is assumed that even in the case where the first insulating sidewalls 76a are formed like the present embodiment, the number of unformed fifth conductive plugs 77 would be reduced.

Note that although the first capacitor protective insulating film 66 is formed on the upper surface of the first layer metal wiring 65 in FIG. 4, the present embodiment is not limited to this. For example, as shown in FIG. 5, the first capacitor protective insulating film 66 on the upper surface of the first layer metal wiring 65 may be etched and removed by setting an etching back time at the time of forming the first insulating sidewalls 67a to be longer or by setting, in the etching back, etching selectivity between the first capacitor protective insulating film 66 and the second insulating film 55 to be smaller.

Figure 5:
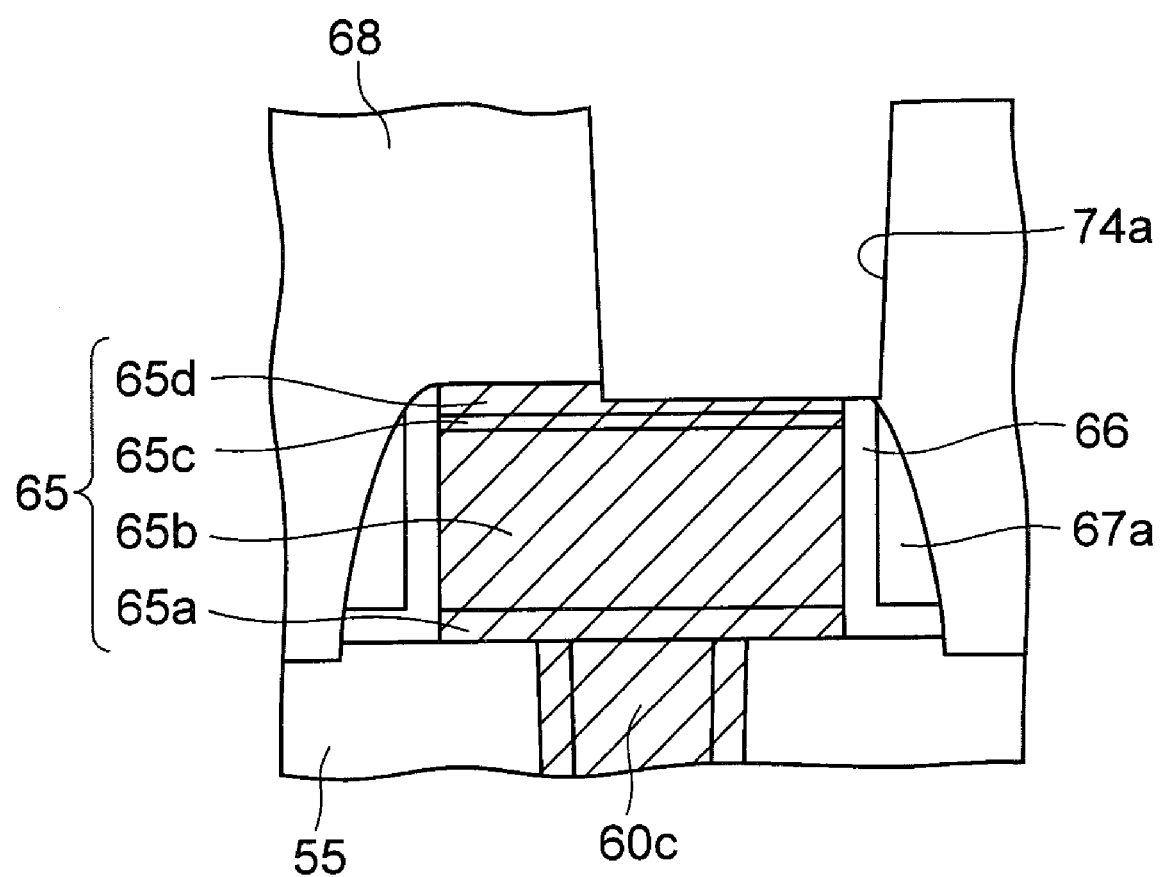
FIG. 5 is an enlarged cross-sectional view showing the case where a first capacitor protective insulating film 66 is removed from an upper surface of the first layer metal wiring 65 in the first embodiment.

Even when the structure shown in FIG. 5 is employed, it can be prevented, like the foregoing description, that a groove is formed in the third hole 74a in the case where the third hole 74a and the first layer metal wiring 65 are misaligned.

In addition, as shown in FIG. 5, even when the first capacitor protective insulating film 66 is removed from the upper surfaces of the second insulating film 55 and the first layer metal wiring 65, the first capacitor protective insulating film 66 remains on the side surfaces of the first layer metal wiring 65. Thereby, the side surfaces of the first layer metal wiring 65 are not exposed to plasmas at the time of forming the third insulating film 68. Thus, it can be reduced to some extent that plasma damages reach the capacitor dielectric film 48a through the first layer metal wiring 65.

It should be noted that in the conventional ferroelectric capacitor, the capacitor dielectric film 48a might suffer from damages due to other factors than the plasma. Such factors includes (i) hydrogen generated in the plasma CVD process, (ii) hydrogen generated at the side surface of the wiring 65, (iii) hydrogen reaching the capacitor by a bias-voltage during the plasma CVD process, and (iv) thermal reaction between the capacitor dielectric film 48a and hydrogen. The present embodiment is also advantageous in preventing the capacitor dielectric film 48a from deteriorating by these factors.

Moreover, as shown in FIG. 5, the first capacitor protective insulating film 66 is absent on the upper surface of the first layer metal wiring 65. Therefore, present embodiment is advantageous in that the third hole 74a can easily be formed by etching.

(3) Second Embodiment

In the above-described first embodiment, a planar-type FeRAM is described. In contrast, in the present embodiment, a stack-type FeRAM, in which a lower electrode of a capacitor is directly connected to a conductive plug thereunder, will be described.

Figure 6A:
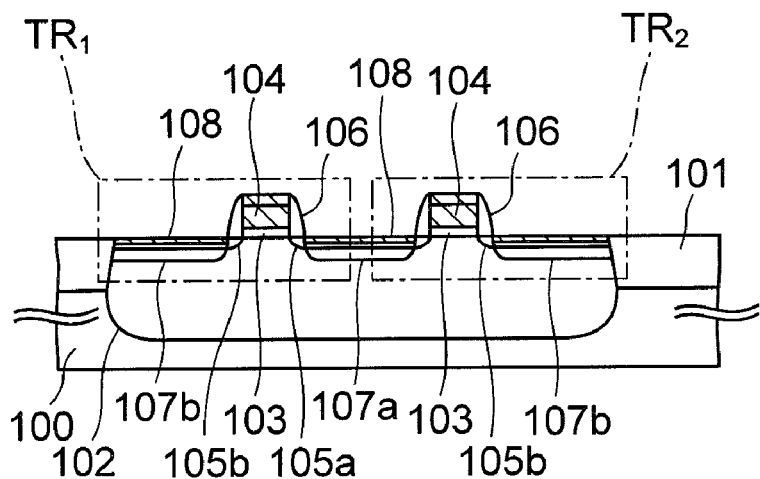
FIGS. 6A to 6S are cross-sectional views showing processes of manufacturing a semiconductor device according to a second embodiment.
Figure 6B:
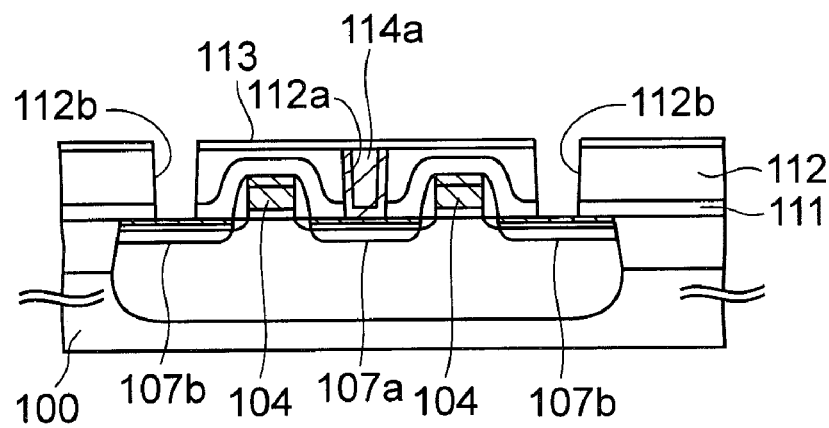
Figure 6C:
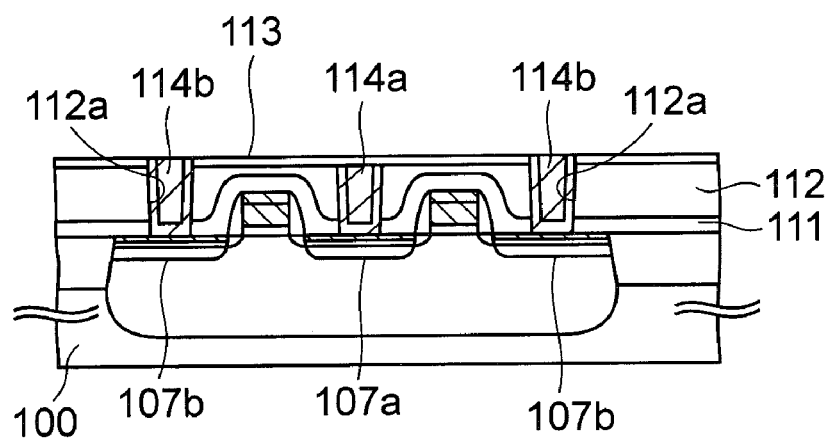
Figure 6D:
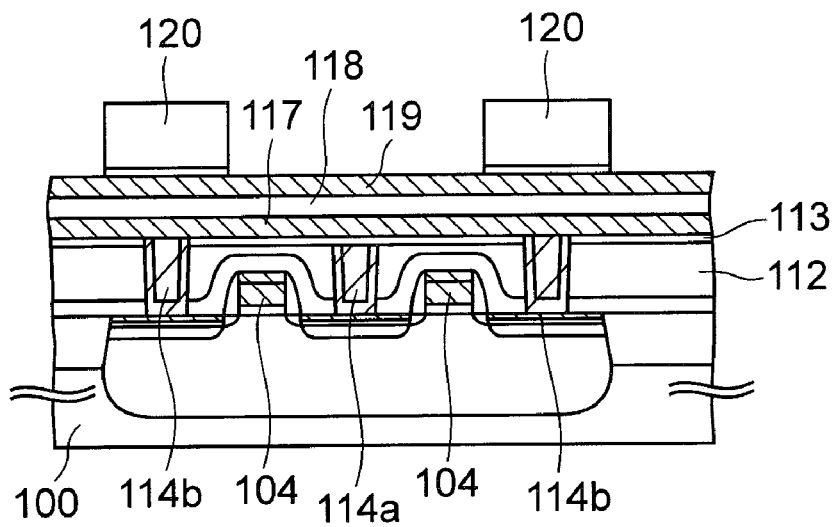
Figure 6E:
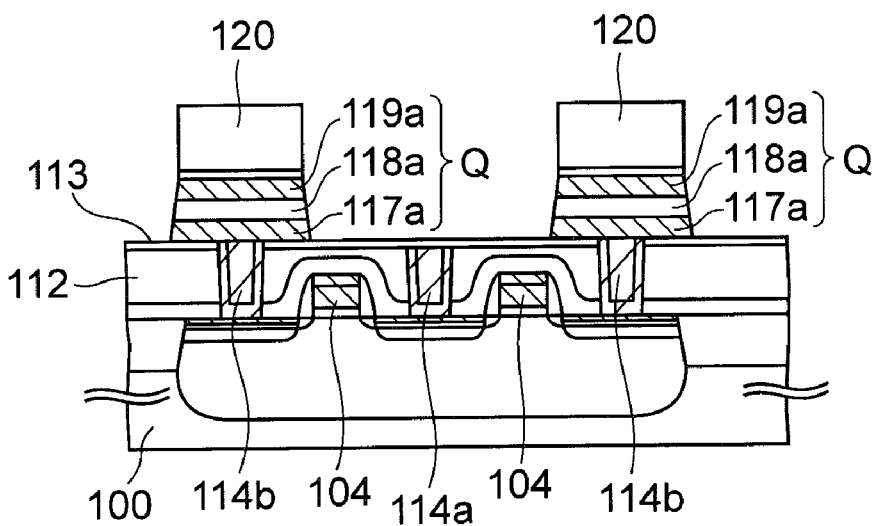
Figure 6F:
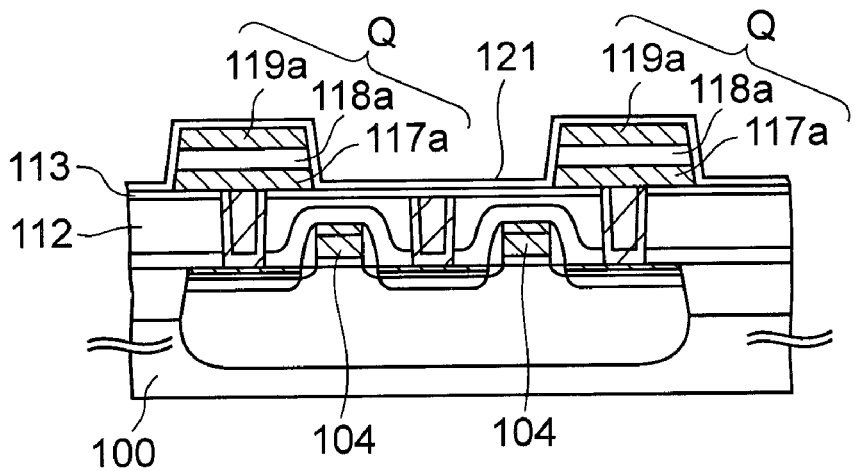
Figure 6G:
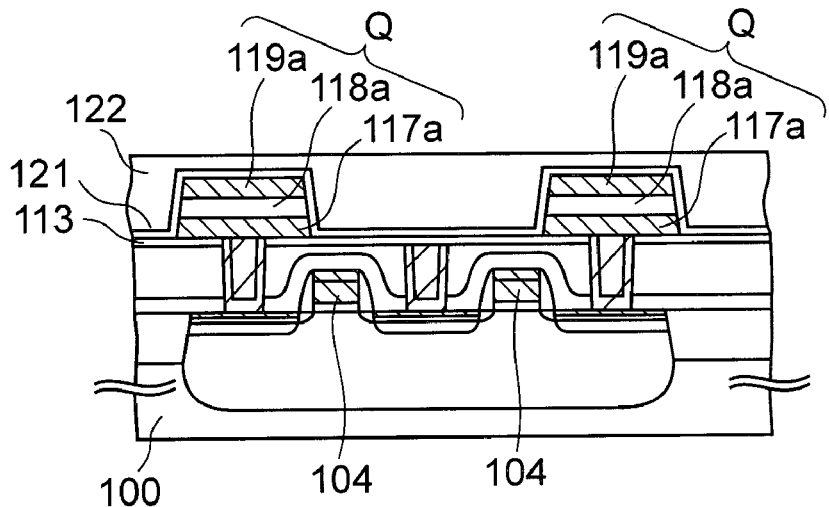
Figure 6H:
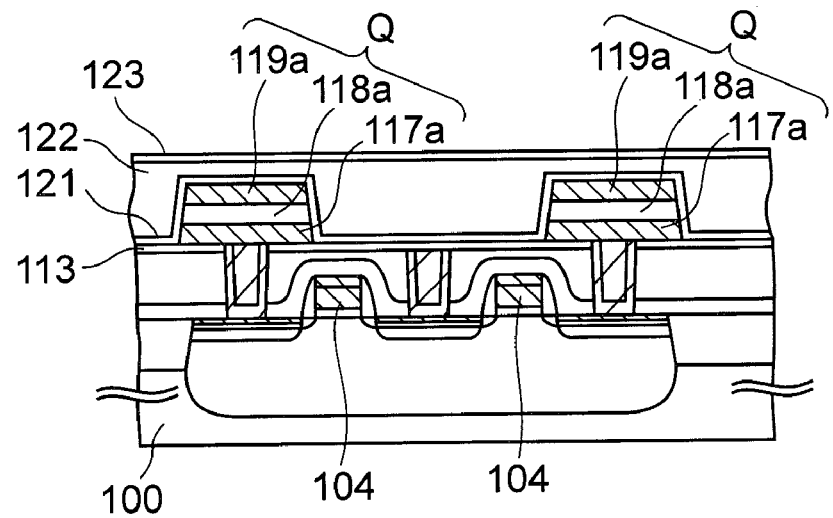
Figure 6I:
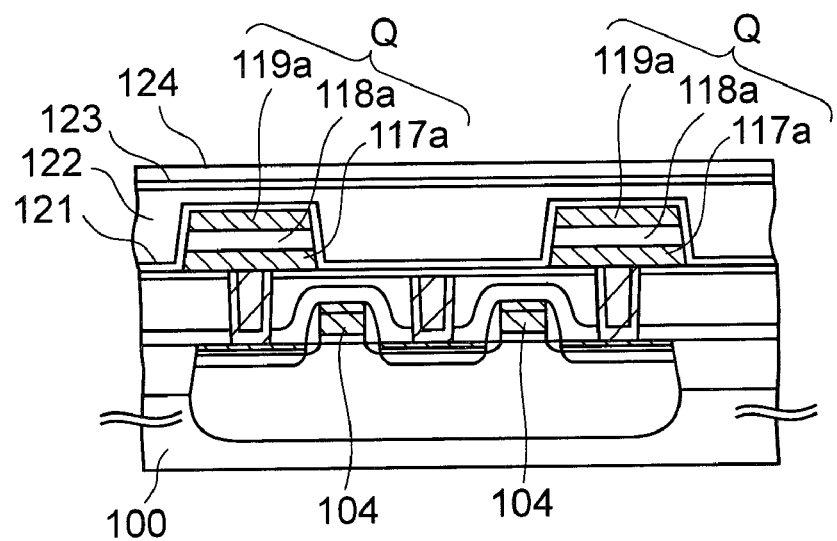
Figure 6J:
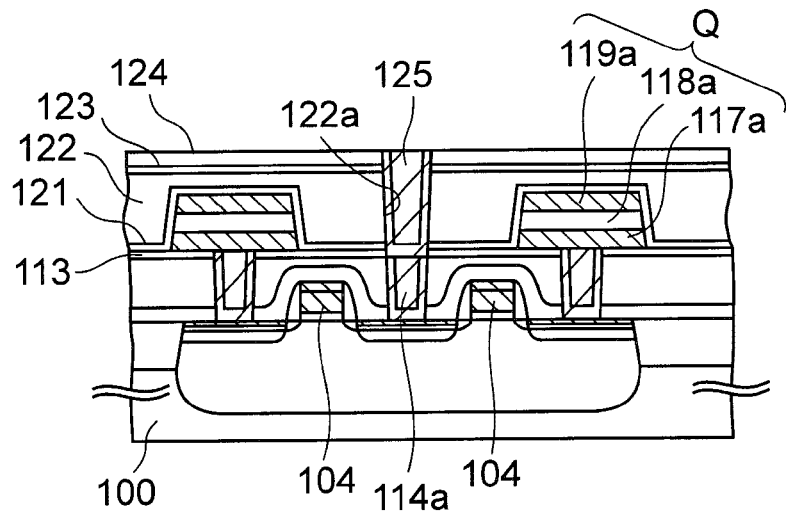
Figure 6K:
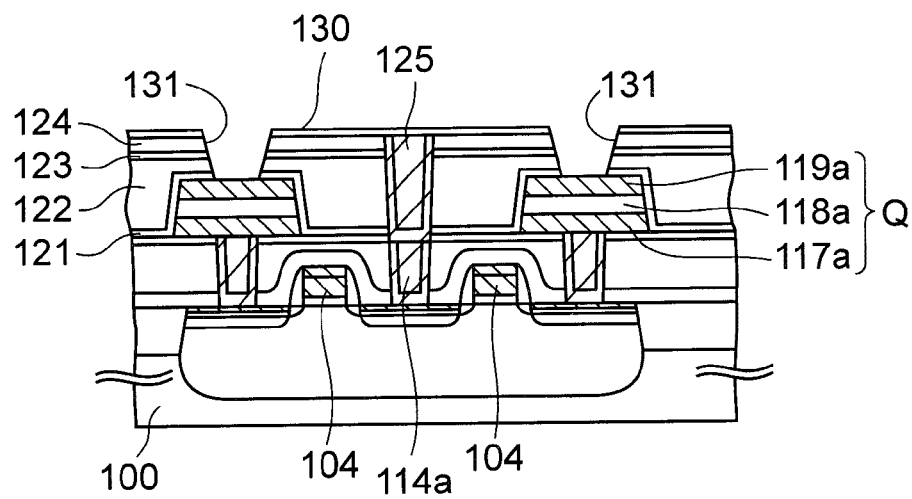
Figure 6L:
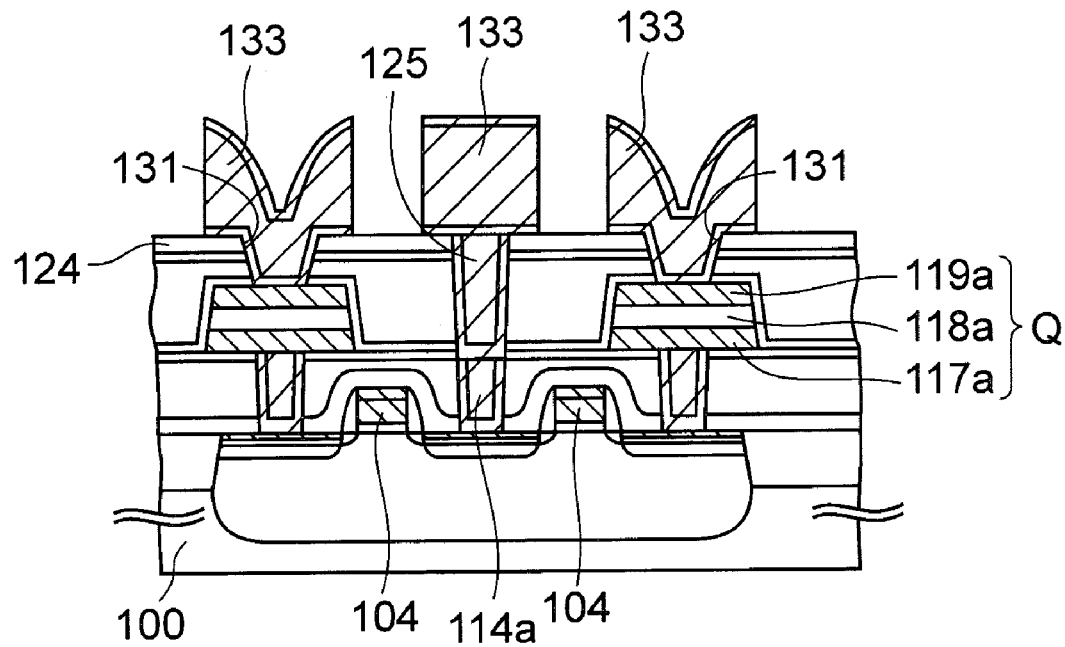
Figure 6M:
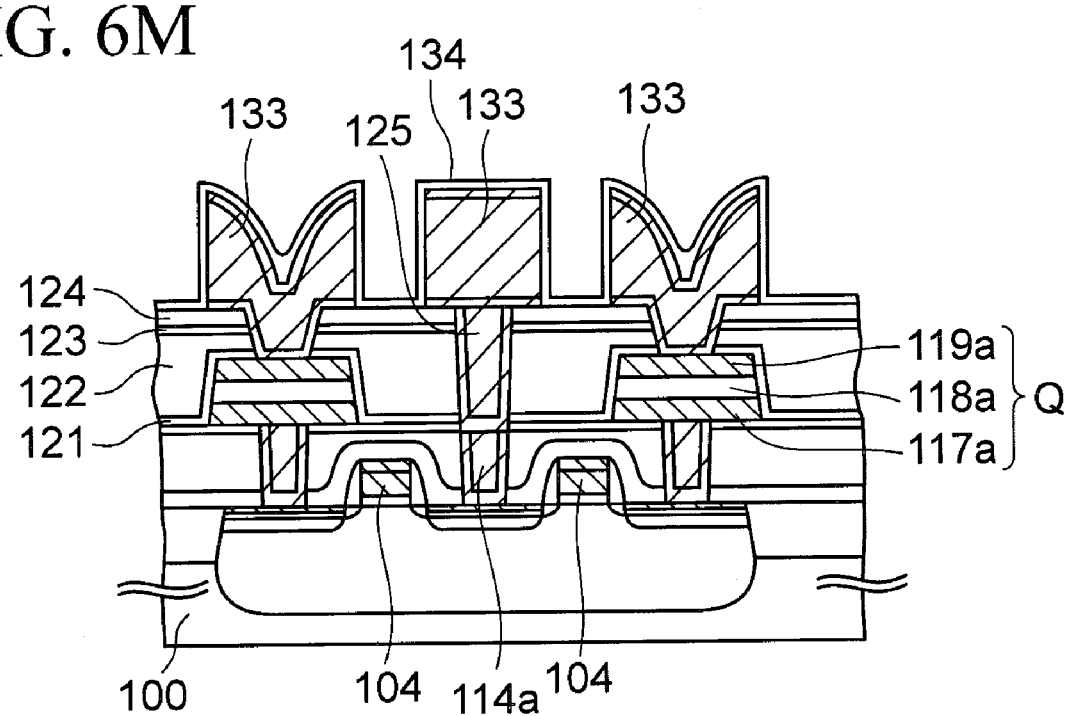
Figure 6N:
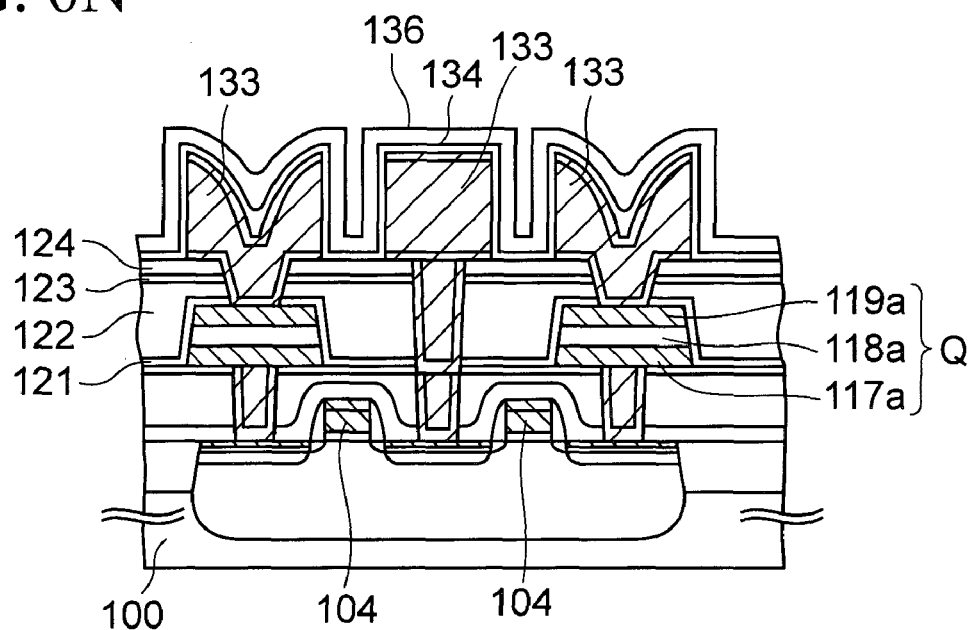
Figure 6O:
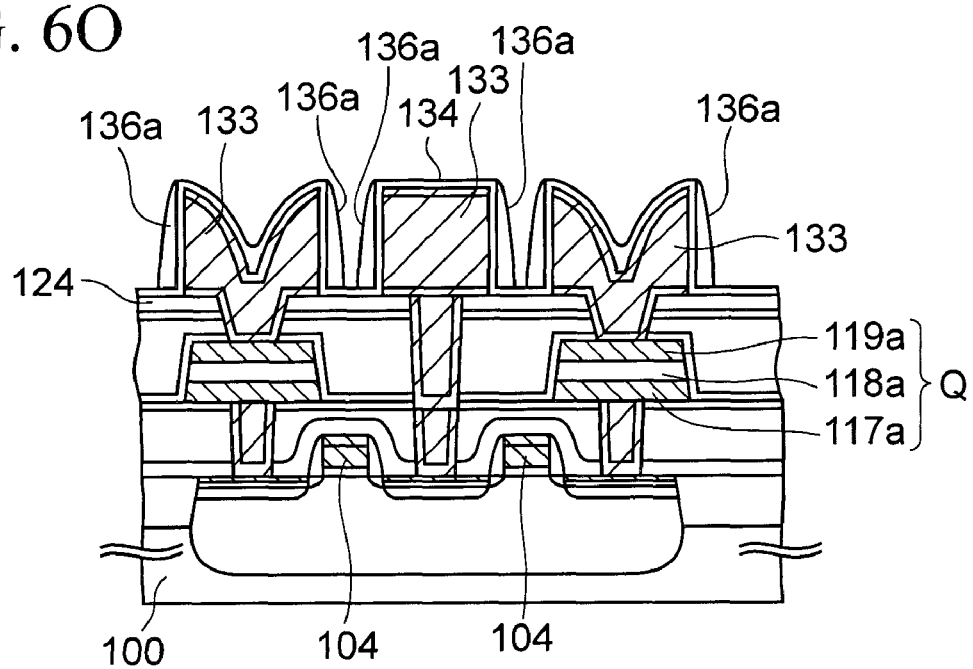
Figure 6P:
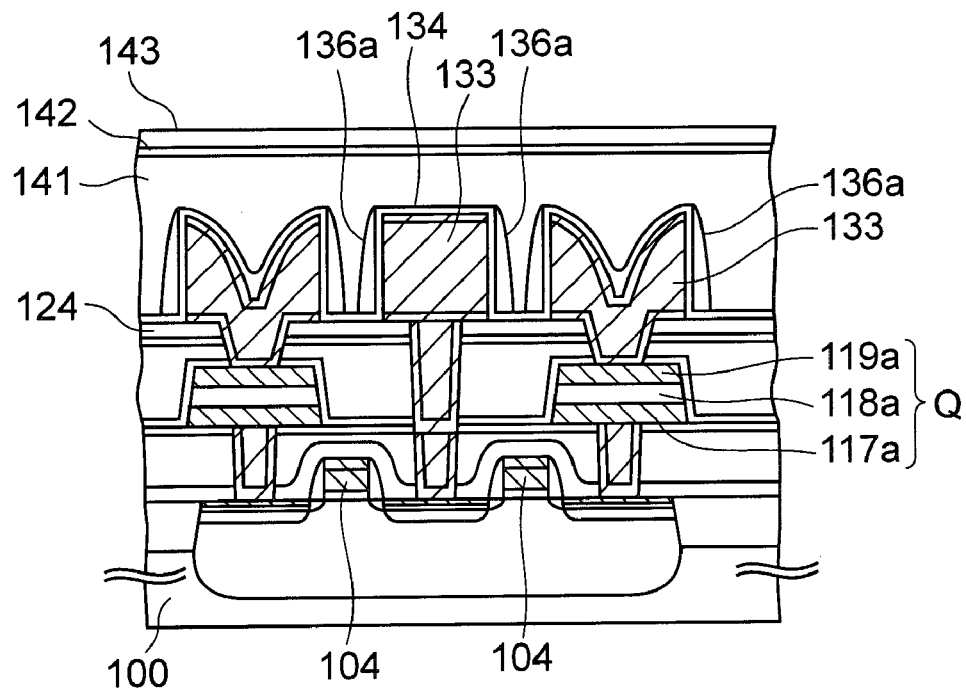
Figure 6Q:
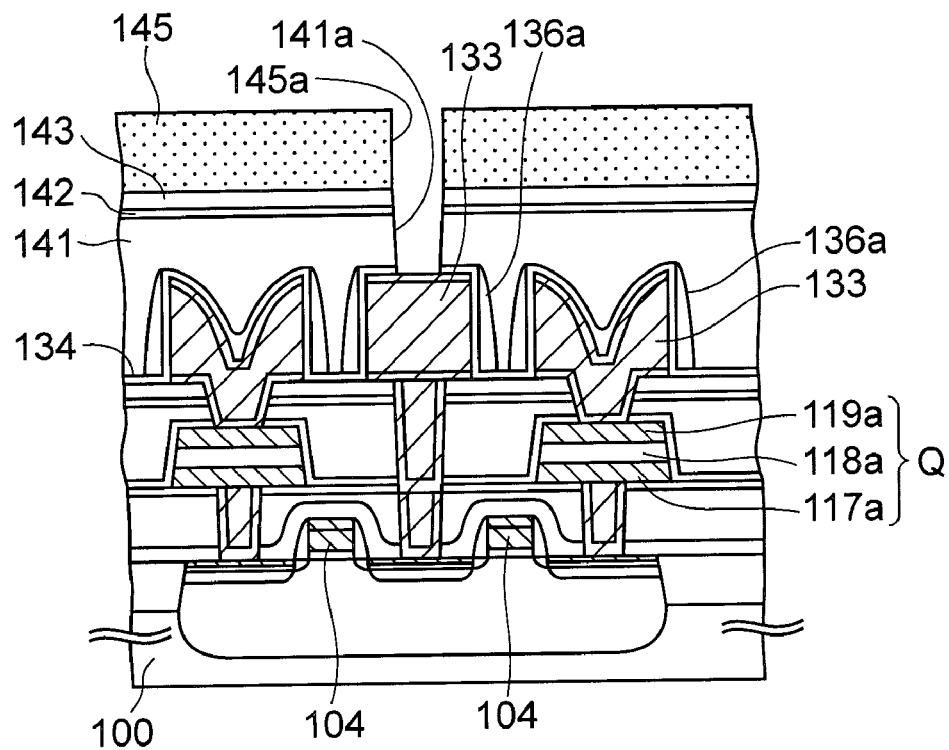
Figure 6R:
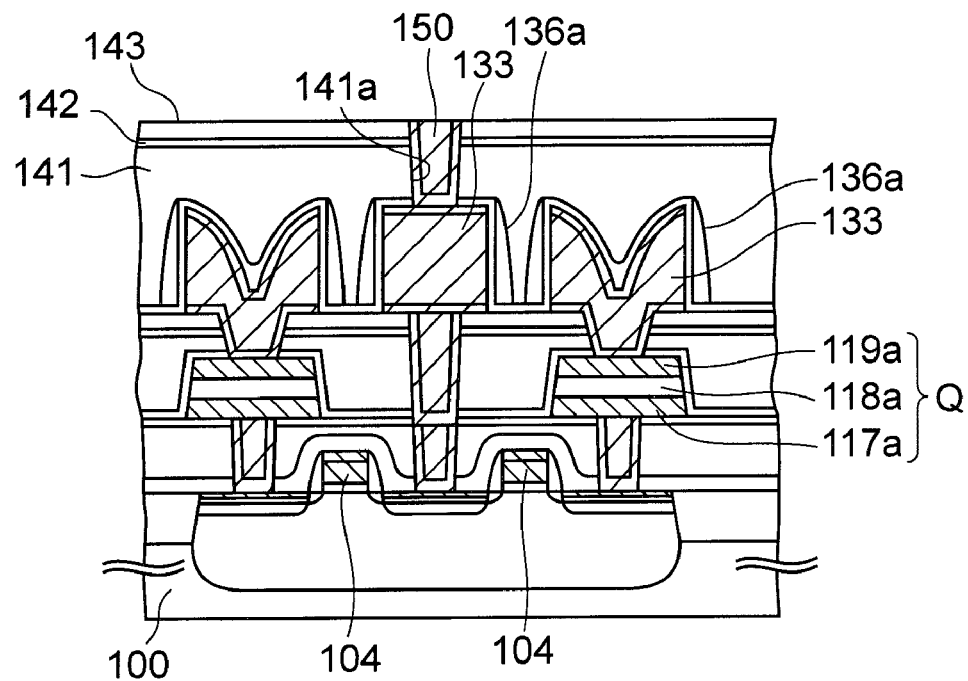
Figure 6S:
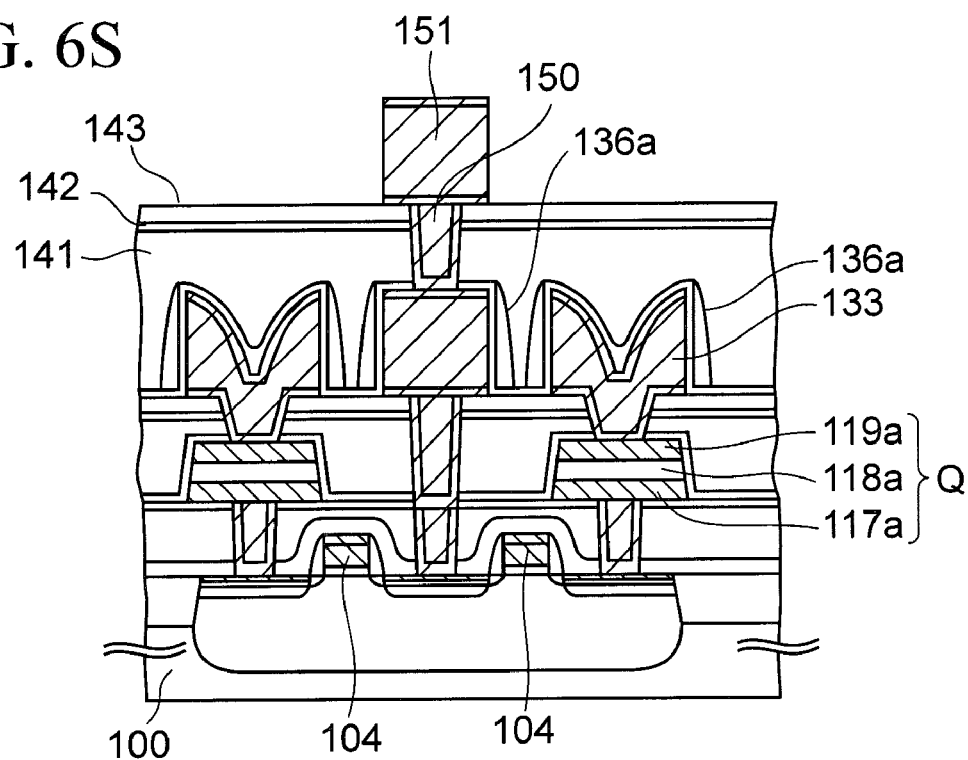

FIGS. 6A to 6S are cross-sectional views showing processes of manufacturing a semiconductor device according to a second embodiment.

Firstly, processes for obtaining a cross-sectional structure shown in FIG. 6A will be described.

Firstly, a groove for STI is formed in a silicon substrate 100. A silicon oxide film as a device isolation insulating film 101 is embedded in this groove to define an active region of the silicon substrate 100 by this device isolation insulating film 101.

Next, boron as a p-type impurity is ion-implanted into the active region of the silicon substrate 100 to form a p-well 102.

Next, a surface of the silicon substrate 100 is thermally oxidized to form a thermal oxidation film to be a gate insulating film 103. Then, an amorphous crystal silicon film and a tungsten silicide film are further formed in this order on the thermal oxidation film. After that, these amorphous silicon film and tungsten silicide film are patterned by photolithography to form two gate electrodes 104 which construct a part of a word line.

Thereafter, while using these gate electrodes 104 as a mask, an n-type impurity is ion-implanted into the silicon substrate 100 to form first and second source/drain extensions 105a and 105b in the silicon substrate beside the gate electrodes 104. In the present embodiment, phosphorus is used as the n-type impurity.

Furthermore, an insulating film, such as a silicon oxide film, is formed on an entire upper surface on the silicon substrate. The insulating film is etched back to be left as insulating spacers 106 beside the gate electrodes 104.

Subsequently, by the ion implantation using the insulating spacers 106 and the gate electrodes 104 as a mask, an n-type impurity, such as arsenic, is introduced to the silicon substrate 100 to form first and second source/drain regions 107a and 107b in the silicon substrate 100 beside the gate electrodes 104.

Furthermore, a cobalt film is formed by a sputtering method as a refractory metal film on the entire upper surface of the silicon substrate 100. Then, the refractory metal film is heated to react with silicon, so that a refractory silicide layer 108, such as a cobalt silicide layer, is formed in the silicon substrate 100 in the first and second source/drain regions 107a and 107b. Thereby, resistance of each of the source/drain regions 107a and 107b is lowered.

Thereafter, the refractory metal layer, which is left unreacted on the device isolation insulating film 101 and the like, is removed by wet etching.

With the processes described so far, first and second MOS transistors $TR_1$ and $TR_2$, which are constructed from the gate insulating film 103, the gate electrodes 104, and the first and second source/drain regions 107a and 107b, are formed in the active region of the silicon substrate 100.

Next, processes for obtaining a cross-sectional structure shown in FIG. 6B will be described.

Firstly, a cover insulating film 111 formed of a silicon oxynitride film and a first insulating film 112 formed of a silicon oxide film are formed in this order on the entire upper surface of the silicon substrate 100 by the plasma CVD method. After that, to remove uneven portions formed on the upper surface of the first insulating film 112 by reflecting shapes of the gate electrodes 104, the upper surface of the first insulating film 112 is polished and planarized by the CMP method.

Subsequently, the cover insulating film 111 and the first insulating film 112 are patterned by photolithography to form a first contact hole 112a on the first source/drain region 107a.

Thereafter, a first conductive plug 114a, which is mainly formed of tungsten, is formed in the first contact hole 112a.

Subsequently, a silicon oxynitride film or a silicon nitride film as a first oxidation preventive insulating film 113 is formed with a thickness of 100 to 500 nm on the upper surfaces of the first conductive plug 114a and the first insulating film 112 by the plasma CVD method. This first oxidation preventive insulating film 113 is formed to prevent the first conductive plug 114a from being oxidized during the process.

Furthermore, films from the first oxidation preventive insulating film 113 through the cover insulating film 111 are patterned to form second contact holes 112b in these insulating films on the second source/drain regions 107b.

Next, processes for obtaining a cross-sectional structure shown in FIG. 6C will be described.

Firstly, a titanium film with a thickness of approximately 30 nm and a titanium nitride film with a thickness of approximately 50 nm are formed in this order on inner surfaces of the second contact holes 112b and the upper surface of the first oxidation preventive insulating film 113 by the sputtering method. These films are set to be a glue film. After that, a tungsten film is formed on the glue film by the CVD method so that the second contact holes 112b are completely embedded by this tungsten film. Then, the excessive glue film and tungsten film on the first oxidation preventive insulating film 113 are polished and removed by the CMP method to leave the glue film and tungsten film only inside the second contact holes 112b as second conductive plugs 114b.

Next, processes for obtaining a cross-sectional structure shown in FIG. 6D will be described.

Firstly, an iridium film as a first conductive film 117 is formed by the DC sputtering method on the upper surfaces of the second conductive plugs 114b and the first oxidation preventive insulating film 113. Film-forming conditions of the iridium film are not particularly limited. In the present embodiment, DC power to be applied to a sputtering target is set to 0.5 kW, a pressure of an argon gas serving as a sputtering gas is set to 0.11 Pa, a substrate temperature is set to 500° C. and a film-forming time is set to 335 seconds.

Furthermore, a PZT film as a ferroelectric film 118 is formed on the first conductive film 117 by the MOCVD method. The organic materials and the flow rates thereof, which are used in the MOCVD, are not particularly limited. In the present embodiment, a flow rate of tetra-hydro-furan (THF) is set to 0.474 ml per minute, a flow rate of a solution in which $Pb(DPM)_2$ being a Pb material is dissolved in THF with a concentration of 0.3 mol per litter is set to 0.326 ml per minute, a flow rate of a solution in which $Zr(dmhd)_4$ being a Zr material is dissolved in THF with a concentration of 0.3 mol per litter is set to 0.2 ml per minute, and a flow rate of a solution in which $Ti(O-iPr)_2(DPM)_2$ being a Ti material is dissolved in THF with a concentration of 0.3 mol per litter is set to 0.2 ml per minute. Then, these solutions, which are vaporized by a vaporizer, are supplied to a reactor, so that the ferroelectric film 118 is formed under conditions with a film-forming pressure of approximately 5 Torr and a substrate temperature of 620° C.

Subsequently, an iridium oxide film is formed with a thickness of approximately 200 nm on the ferroelectric film 118 by the sputtering method. The iridium oxide film thus formed is used as a second conductive film 119.

Thereafter, to recover damages received in the ferroelectric film 118 at the time of forming the second conductive film 119, recovery annealing is carried out on the ferroelectric film 118 in a vertical furnace whose inside is filled with an oxygen-containing atmosphere, under conditions with a substrate temperature of 500° C. and a processing time of 60 minutes.

After that, a titanium nitride film and a silicon oxide film are formed in this order on the second conductive film 119. Then, these films are patterned to form hard masks 120 in a capacitor planar shape.

Next, as shown in FIG. 6E, while using the hard masks 120 as an etching mask, the first conductive film 117, the ferroelectric film 118, and the second conductive film 119 are integrally dry-etched. Thereby, capacitors Q, each of which is formed by sequentially stacking a lower electrode 117a, a capacitor dielectric film 118a, and an upper electrode 119a, are formed.

Thereafter, the hard masks 120 are removed.

Next, as shown in FIG. 6F, a first alumina film 121 of approximately 20 nm is formed on the upper surface of the first oxidation preventive insulating film 113 and on surfaces of the capacitors Q by the atomic layer deposition (ALD) method using, for example, trimethylalminium (TMA) and O₃ as materials. The first alumina film 121 functions so as to protect the capacitor dielectric film 118a from reductants, such as hydrogen and moisture. In addition, by using, as a film-forming method of the capacitor dielectric film 118a, the ALD method capable of forming a film excellent in the step coverage characteristic, the first alumina film 121 can be formed with a sufficient thickness on the sides of the capacitors Q even when miniaturization is advanced to narrow a distance between the capacitors Q.

Thereafter, to recover damages received in the capacitor dielectric film 118a, recovery annealing is carried out in the oxygen-containing atmosphere at the substrate temperature of 650° C. The recovery annealing is carried out by using, for example, a vertical furnace.

Next, as shown in FIG. 6G, a silicon oxide film as a second insulating film 122 is formed on the first alumina film 121 by the plasma CVD method using a TEOS gas, so that space between the adjacent capacitors Q is embedded by the second insulating film 122. Thereafter, the upper surface of the second insulating film 122 is polished and planarized by the CMP method to set the thickness of the second insulating film 122 on the upper electrodes 119a to be approximately 300 nm.

Thereafter, annealing is carried out on the second insulating film 122 to dehydrate the second insulating film 122.

Next, as shown in FIG. 6H, a second alumina film 123 is formed with a thickness of approximately 50 nm by the sputtering method on the planarized second insulating film 122 in order to protect the capacitor dielectric film 118a from a reducing atmosphere.

Furthermore, as shown in FIG. 6I, a silicon oxide film is formed with a thickness of approximately 100 nm on the second alumina film 123 by the plasma CVD method using the TEOS gas. This silicon oxide film is set to be a first cap insulating film 124.

Next, processes for obtaining a cross-sectional structure shown in FIG. 6J will be described.

Firstly, the insulating films 113, and 121 to 124 are patterned by photolithography to from a first hole 122a in these insulating films on the first conductive plug 114a.

After that, on an inner surface of the first hole 122a and the upper surface of the first cap insulating film 124, a titanium film and a titanium nitride film are formed in this order as a glue film with a thickness of approximately 50 nm by the sputtering method. Furthermore, a tungsten film is formed on this glue film by the CVD method to completely fill the first hole 122a by this tungsten film. Thereafter, the excessive glue film and tungsten film on the first cap insulating film 124 are polished and removed by the CMP method to leave the glue film and the tungsten film only inside the first hole 122a as a third conductive plug 125.

Next, as shown in FIG. 6K, a silicon oxynitride film is formed with a thickness of approximately 100 nm by the CVD method on the upper surfaces of the first cap insulating film 124 and the third conductive plug 125. The resultant film is set to be an oxidation preventive insulating film 130.

Then, films from the oxidation preventive insulating film 130 through the first alumna film 121 are patterned to form second holes 131 in the second insulating film 122 on the upper electrode 119a. The capacitors Q that received damages by forming the second holes 131 are recovered by annealing. The annealing is carried out, for example, in an oxygen-containing atmosphere at a substrate temperature of 550° C. for approximately 60 minutes.

The oxidation preventive insulating film 130 has been formed in advance of the annealing as described above, so that contact defect due to oxidation of the third conductive plug 125 during the annealing can be prevented.

After the annealing is finished, the oxidation preventive insulating film 130 is removed by etching back.

Next, processes for obtaining a cross-sectional structure shown in FIG. 6L will be described.

Firstly, a multilayer metal film is formed by the sputtering method on inner surfaces of the second holes 131 and on the upper surface of the first cap insulating film 124. The multilayer metal film is formed by sequentially laminating, for example, a titanium film with a thickness of approximately 60 nm, a titanium nitride film with a thickness of approximately 30 nm, a copper-containing aluminum film with a thickness of approximately 400 nm, a titanium film with a thickness of approximately 5 nm, and then a titanium nitride film with a thickness of approximately 70 nm.

Thereafter, the multilayer metal film is patterned by photolithography to form first layer metal wirings 133 which are electrically connected to the upper electrodes 119a through the second holes 131.

Next, as shown in FIG. 6M, an alumina film is formed with a thickness of approximately 20 nm on the first cap insulating film 124 and the first layer metal wirings 133 by the sputtering method. This alumina film is used as a first capacitor protective insulating film 134. The first capacitor protective insulating film 134 is excellent in blocking reductants, such as hydrogen and moisture, and functions to prevent the capacitor dielectric film 118a from being deteriorated by these externally penetrating materials.

Next, as shown in FIG. 6N, a silicon oxynitride film as a sidewall insulating film 136 is formed with a thickness of approximately 150 nm on the first capacitor protective insulating film 134 by the plasma CVD method. Note that the sidewall insulating film 136 is not limited to the silicon oxynitride film, and a silicon nitride film formed by the plasma CVD method may be employed as the sidewall insulating film 136.

Furthermore, as described in the first embodiment, plasma damages to be received in the capacitor dielectric film 118 through the first layer metal wirings 133 can be reduced when the sidewall insulating film 136 is formed by the sputtering method in place of the plasma CVD method.

Next, as shown in FIG. 6O, the sidewall insulating film 136 is etched back by plasma etching to leave the sidewall insulating film 136 beside the first layer metal wirings 133 as insulating sidewalls 136a.

The etching back is carried out, for example, in a parallel plate-type plasma etching chamber. In the present embodiment, high-frequency power with a frequency of 13.56 MHz and power of 400 W is applied to a showerhead provided in the chamber so as to face the silicon substrate 100. Furthermore, as etching gases, $CHF_3$, $CF_4$, and Ar are supplied to the chamber with flow rates of 40 sccm, 80 sccm, and 1000 sccm, respectively. In addition, the inside of the chamber is depressurized to an extent of approximately 1700 m Torr by an unillustrated pump. In this manner, the etching back is carried out.

Note that in this example, the first capacitor protective insulating film 134 is designed to be left on the upper surfaces of the first layer metal wirings 133 even after the etching back. However, the first capacitor protective insulating film 134 may be designed to be removed from the upper surfaces of the first layer metal wirings 133 at the time of forming the insulating sidewalls 136a by setting the etching back to be rather over etching.

Next, as shown in FIG. 6P, a silicon oxide film is formed on the first capacitor protective insulating film 134 and the insulating sidewalls 136a by the plasma CVD method using the TEOS gas. The silicon oxide film thus formed is used as a third insulating film 141.

Thereafter, the upper surface of the third insulating film 141 is polished by the CMP method to planarize unevenness formed on the upper surface of the third insulating film 141 by reflecting shapes of the first layer metal wirings 133.

Subsequently, an alumina film as a second capacitor protective insulating film 142 for protecting the capacitor dielectric film 118a from reductants is formed with a thickness of approximately 50 nm on the third insulating film 141 by the sputtering method.

Furthermore, a silicon oxide film is formed on the second capacitor protective insulating film 142 as a second cap insulating film 143 by the plasma CVD method using the TEOS gas. The thickness of the second cap insulating film 143 is, for example, approximately 100 nm.

Next, processing for obtaining a cross-sectional structure shown in FIG. 6Q will be described.

Firstly, the second cap insulating film 143 is coated with a photoresist. The photoresist is then exposed and developed to form a resist pattern 145 provided with a hole-shaped window 145a above the first layer metal wiring 133.

After that, the insulating films 134 and 141 to 143 are dry-etched through the above-described window 145a, so that a second hole 141a is formed in these films over the first layer metal wiring 133.

Conditions for this etching are not particularly limited. In the present embodiment, a parallel plate-type plasma etching chamber (not shown) is used and $C_4F_8$, Ar, and $O_2$ are supplied to the chamber as etching gases with flow rates of 20 sccm, 500 sccm, and 12 sccm, respectively. After the etching gases are depressurized to an extent of approximately 50 m Torr by evacuating the inside of the chamber by an unillustrated pump, high-frequency power (source power) with a frequency of 27.12 MHz and power of 2000 W is applied to the upper electrode in the chamber, and high-frequency power (bias power) with a frequency of 800 kHz and power of 900 W is applied to the lower electrode in the chamber. Thereby, the etching gases are caused to be plasmas.

According to such etching conditions, the etching rate of the insulating sidewall 136a made of silicon oxynitride becomes lower than that of the third insulating film 141 made of silicon oxide. Accordingly, even when one portion of the second hole 141a is displaced from the first layer metal wiring 133 due to misalignment, the insulating sidewalls 136a become an etching stopper, so that a groove is not formed in the bottom of the second hole 141a.

Accordingly, at the time when the second hole 141a is formed, etching products, which are generated from the first and second capacitor protective insulating films 134 and 142 made of alumina and is poor in reactivity, are hardly stuck in the second hole 141a. Similarly, even when the inside of the second hole 141a is cleaned by cleaning water after this etching, water hardly remains residual in the second hole 141a.

Thereafter, the resist pattern 145 is removed.

Next, processes for obtaining a cross-sectional structure shown in FIG. 6R will be described.

Firstly, a titanium nitride film as a glue film is formed by the sputtering method on the inner surface of the second hole 141a and on the upper surface of the second cap insulating film 143. After that, a tungsten film is formed on this glue film by the CVD method to completely fill the second hole 141a by the tungsten film. Furthermore, the excessive glue film and tungsten film on the second cap insulating film 143 are polished and removed by the CMP method to leave the glue film and the tungsten film only in the second hole 141a as a second conductive plug 150.

The second conductive plug 150 is electrically connected to the first layer metal wiring 133 on the second source/drain region 107b and constructs a part of a bit line.

Here, as described above, even when the second hole 141a and the first layer metal wiring 133 are misaligned, a groove in which foreign materials, such as etching products containing alumina, is easily stuck, is not formed in the second hole 141a in the portion where it is displaced from the first layer metal wiring 133. Accordingly, at the time when the above-described tungsten film is formed, degassing generated from the heated foreign materials is reduced. Thereby, it is possible to avoid such an inconvenience that the second conductive plug 150 is left unformed due to the degassing.

Next, as shown in FIG. 6S, a multilayer metal film is formed on the second cap insulating film 143 and the second conductive plug 150. Thereafter, the multilayer metal film is patterned to form a second layer metal wiring 151.

With the processes described so far, the basic structure of the semiconductor device according to the present embodiment is completed.

According to the above-described present embodiment, as described by referring to FIG. 6Q, the insulating sidewalls 136a are formed on the side surfaces of the first layer metal wirings 133, and the second hole 141a is formed under the etching condition that the etching rate of the insulating sidewalls 136a becomes lower than that of the third insulating film 141.

Thereby, like the first embodiment, even when the second hole 141a is misaligned and one portion thereof overlaps with the insulating sidewall 136a, a narrow groove is not formed under the second hole 141a in the misaligned portion. Accordingly, foreign materials, such as etching products containing alumina which is difficult to be removed and cleaning water, do not enter the groove. As a result, at the time when the second conductive plug 150 (see FIG. 6R) is formed in the second hole 141a, degassing caused by the heated foreign materials is hardly generated. Accordingly, such inconveniences that the second conductive plug 150 is left unformed due to degassing and that contact resistance between the second conductive plug 150 and the first layer metal wiring 133 is reduced, are not caused. Consequently, a FeRAM with high reliability can be provided.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device comprising:

forming a first insulating film over a semiconductor substrate;

forming a capacitor over the first insulating film, the capacitor having a lower electrode, a capacitor dielectric film made of a ferroelectric material, and an upper electrode;

forming a second insulating film covering the capacitor;

forming a first hole in the second insulating film above the lower electrode;

forming an aluminum film over the second insulating film and in the first hole;

patterning the aluminum film to form a metal wiring that directly contacts the lower electrode;

forming a first capacitor protective insulating film covering the metal wiring and the second insulating film;

forming a third insulating film over the first capacitor protective insulating film;

etching the third insulating film to remove the third insulating film located above the metal wiring and to form an insulating sidewall on the first capacitor protective insulating film beside the metal wiring;

forming a fourth insulating film over the insulating sidewall to cover the metal wiring with the fourth insulating film;

polishing the fourth insulating film;

after polishing the fourth insulating film, forming a second hole, which reaches the metal wiring that contacts the lower electrode, in the fourth insulating film over the metal wiring by selectively etching the fourth insulating film under an etching condition that an etching rate of the insulating sidewall becomes lower than that of the fourth insulating film; and forming a conductive plug, which is connected to the metal wiring, in the second hole.

2. The method of manufacturing a semiconductor device according to claim 1, wherein a sidewall made of any one of silicon nitride and silicon oxynitride is formed as the insulating sidewall.

3. The method of manufacturing a semiconductor device according to claim 1, wherein the third insulating film is formed by a sputtering method.

4. The method of manufacturing a semiconductor device according to claim 1, wherein, when etching the third insulating film, the first capacitor protective insulating film on an upper surface of the metal wiring is etched and removed so that the upper surface is exposed.

5. The method of manufacturing a semiconductor device according to claim 1, wherein an alumina film is formed as the first capacitor protective insulating film.

6. The method of manufacturing a semiconductor device according to claim 5, wherein a thickness of the alumina film is at least 20 nm but no more than 100 nm.

7. The method of manufacturing a semiconductor device according to claim 1, wherein a silicon oxide film is formed by a sputtering method as the first capacitor protective insulating film.

8. The method of manufacturing a semiconductor device according to claim 1, wherein, when forming the conductive plug, a plug containing tungsten is formed.

9. The method of manufacturing a semiconductor device according to claim 8, wherein the formation of the conductive plug includes:

forming a glue film on the inner surface of the hole; and forming, on the glue film, a tungsten film with a thickness that fills the hole.

10. The method of manufacturing a semiconductor device according to claim 1, wherein a metal laminated film including an aluminum film is formed as the metal wiring.

11. The method of manufacturing a semiconductor device according to claim 10, wherein a titanium nitride film is formed as an uppermost film of the metal laminated film.

12. The method of manufacturing a semiconductor device according to claim 1, further comprising:

forming a second capacitor protective insulating film over the fourth insulating film, wherein, when forming the hole, the hole is formed through the second capacitor protective insulating film.

13. The method of manufacturing a semiconductor device according to claim 12, wherein an alumina film is formed as the second capacitor protective insulating film.

14. The method of manufacturing a semiconductor device according to claim 1, further comprising:

cleaning an inner surface of the second hole by a cleaning water.

15. The method of manufacturing a semiconductor device according to claim 5, wherein the alumina film is formed by a sputtering method.

* * * * *